United States Patent [19]
Matsuura et al.

[11] Patent Number: 5,503,910
[45] Date of Patent: Apr. 2, 1996

[54] ORGANIC ELECTROLUMINESCENCE DEVICE

[75] Inventors: Masahide Matsuura; Hiroshi Tokailin; Hisahiro Higashi; Tadashi Kusumoto, all of Sodegaura, Japan

[73] Assignee: Idemitsu Kosan Co., Ltd., Tokyo, Japan

[21] Appl. No.: 219,384

[22] Filed: Mar. 29, 1994

[51] Int. Cl.$^6$ ............................................. B32B 7/02
[52] U.S. Cl. ........................ 428/212; 428/213; 428/690; 428/917; 313/504; 313/506
[58] Field of Search ................... 428/690, 917, 428/212, 213; 313/503, 504, 506; 252/301.21, 301.35

[56] References Cited

U.S. PATENT DOCUMENTS

| | | | |
|---|---|---|---|
| 5,126,214 | 6/1992 | Tokailin et al. | 428/690 |
| 5,283,132 | 2/1994 | Ogura et al. | 428/690 |
| 5,294,810 | 3/1994 | Egusa et al. | 257/40 |
| 5,294,869 | 3/1994 | Tang et al. | 313/504 |
| 5,405,709 | 4/1995 | Littman et al. | 428/690 |

*Primary Examiner*—Patrick J. Ryan
*Assistant Examiner*—Marie R. Yamnitzky
*Attorney, Agent, or Firm*—Oblon, Spivak, McClelland, Maier & Neustadt

[57] ABSTRACT

An organic electroluminescence device comprises the first light emitting layer containing an organic compound having a fluorescence peak wave length of 380 nm or longer to shorter than 480 nm in solid state and the second light emitting layer containing an organic compound having a fluorescence peak wave length of 480 nm or longer to shorter than 580 nm in solid state. One of the first light emitting layer and the second light emitting layer contains an organic compound having a fluorescence peak wave length of 580 nm or longer to 650 nm or shorter in solution state. The device has a structure in which the first light emitting layer and the second light emitting layer are laminated on the anode in this order and both of these layers emit light by application of an electric field. This device shows light emission, particularly white light emission, with high efficiency and excellent stability.

48 Claims, 2 Drawing Sheets

▨ : REGION OF WHITE LIGHT ON THE CIE CHROMATICITY DIAGRAM

⊠ : REGION OF WHITE LIGHT ON THE CIE CHROMATICITY DIAGRAM

CIE CHROMATICITY DIAGRAM

ORGANIC ELECTROLUMINESCENCE DEVICE

BACKGROUND OF THE INVENTION

1. Field of the Invention

The present invention relates to a novel organic electroluminescense device, and more particularly, to an organic electroluminescence device showing light emission, particularly white light emission, with high efficiency and excellent stability.

2. Description of the Related Arts

An electroluminescence device (hereinafter referred to as EL device) has features in a high self-distinguishability because of its self-emission, and a high impact resistance because it is a completely solid device.

Various EL devices using inorganic and organic compounds are proposed at present and attempts to put them into practice use have been made. Among these devices, organic EL devices permit drastically low voltage to be applied and, therefore, developments of various materials for these devices as well as devices have been undertaken. Furthermore, they are useful for weight reduction of conventionally used devices for exhibition, such as a back light, a display and the like.

Technologies described in the following have heretofore been disclosed on the organic EL devices showing white light emission. However, these technologies have various drawbacks described also in the following.

For example, in a technology disclosed in European Patent Application Laid-Open No. 0390551, a carrier is introduced by tunneling injection making use of accumulation of the carrier at an interface. A threshold voltage exists for emission of white light because of this mechanism. Therefore, gradation cannot be exhibited in this method because light emitted below the threshold voltage is not white. In a technology disclosed in Japanese Patent Application Laid-Open No. 230584/1991, lights of different colors emitted from two kinds of luminescent material are mixed. White light of good quality cannot be obtained because of this mechanism. In a technology disclosed in Japanese Patent Application Laid-Open No. 220390/1990, white light is emitted. However, luminance is 110 cd/m² at an applied voltage of 30 V and efficiency of light emission is lower than that expected from the driving voltage. In a technology disclosed in Japanese Patent Application Laid-Open No. 51491/1992, a structure in which light emission is made at face ends is adopted. This is not suitable for applications requiting light emission from the whole surface.

SUMMARY OF THE INVENTION

An object of the present invention is to provide an organic EL device showing light emission with high efficiency and excellent stability while the characteristics of conventional EL devices are maintained.

Another object of the present invention is to provide an organic EL device showing the white light emission with high efficiency and excellent stability.

Still another object of the present invention is to provide an organic EL device effective as a light emission device in various kinds of displaying apparatus.

Thus, the present invention provides an organic electroluminescence device which comprises light emitting layers placed between a pair of electrodes at least one of which is transparent or translucent, said light emitting layers comprising the first light emitting layer containing an organic compound having a fluorescence peak wave length of 380 nm or longer to shorter than 480 nm in solid state and the second light emitting layer containing an organic compound having a fluorescence peak wave length of 480 nm or longer to shorter than 580 nm in solid state, and one of the first light emitting layer and the second light emitting layer containing an organic compound having a fluorescence peak wave length of 580 nm or longer to 650 nm or shorter in solution state in a concentration of 0.1 to 10 mol % of abovementioned compound contained in the first light emitting layer or in the second light emitting layer; and has a structure in which the first light emitting layer and the second light emitting layer are laminated on the anode in this order and both of the first light emitting layer and the second light emitting layer emit light by application of an electric field.

Mixing the third component into the first light emitting layer or the second light emitting layer as described above means controlling carrier transporting ability in each layers from the point of view of carrier injection and transport. Furthermore, recombination regions are formed in the first light emitting layer and in the second light emitting layer by controlling thickness of the layers. Effects of various components on the light emission are brought to an appropriate balance by specifying the thickness structure and the order of lamination of the layers in addition to the above. The light emission, particularly the white light emission, of the present invention has been realized as the result of these achievements.

DESCRIPTION OF PREFERRED EMBODIMENTS

The organic EL device of the present invention is characterized by the two light emitting layers comprised in it, which are the first light emitting layer and the second light emitting layer. In the first light emitting layer, an organic compound having a fluorescence peak wave length of 380 nm or longer to shorter than 480 nm (bluish), preferably 420 nm or longer to shorter than 475 nm, in solid state is used. In the second light emitting layer, an organic compound having a fluorescence peak wave length of 480 nm or longer to shorter than 580 nm (greenish), preferably 490 nm or longer to shorter than 560 nm, in solid state is used.

The organic EL device of the present invention is also characterized in that, in one of the first light emitting layer and the second light emitting layer described above, an organic compound having a fluorescence peak wave length of 580 nm or longer to 650 nm or shorter (reddish), preferably 585 nm or longer to 620 nm or shorter, in solution state is contained in a concentration of 0.1 to 10 mol %, preferably 0.5 to 5 mol %, of the organic compound forming the selected layer. The concentration range of 0.1 to 10 mol % is selected to avoid loss of light by the effect of concentration. When the organic compound has two or more peaks in the fluorescence spectrum, it is sufficient that the compound has at least one peak in the specific wave length region described above.

The white light from the organic EL device of the present invention can be obtained by superposition of lights from the first light emitting layer, the second light emitting layer and the added component described above (in other words, superposition of lights of the three primary colors emitted respectively from the three kinds of organic compound having the specific fluorescence peak wave lengths described above).

Figure 1:
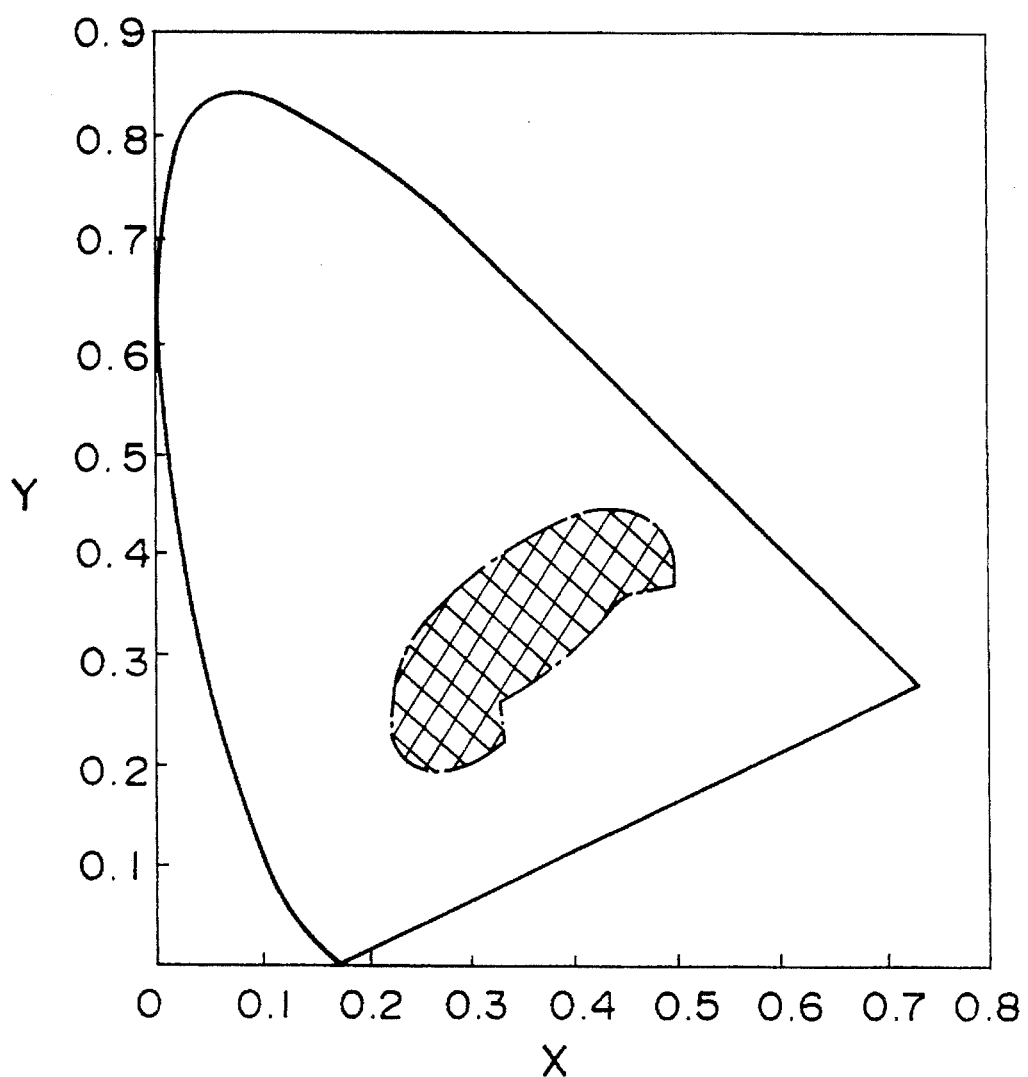
FIG. 1 is a graph showing the region defining white light on the CIE chromaticity diagram.

In FIG. 1, definition of the white light is shown on the CIE diagram.

Figure 2:
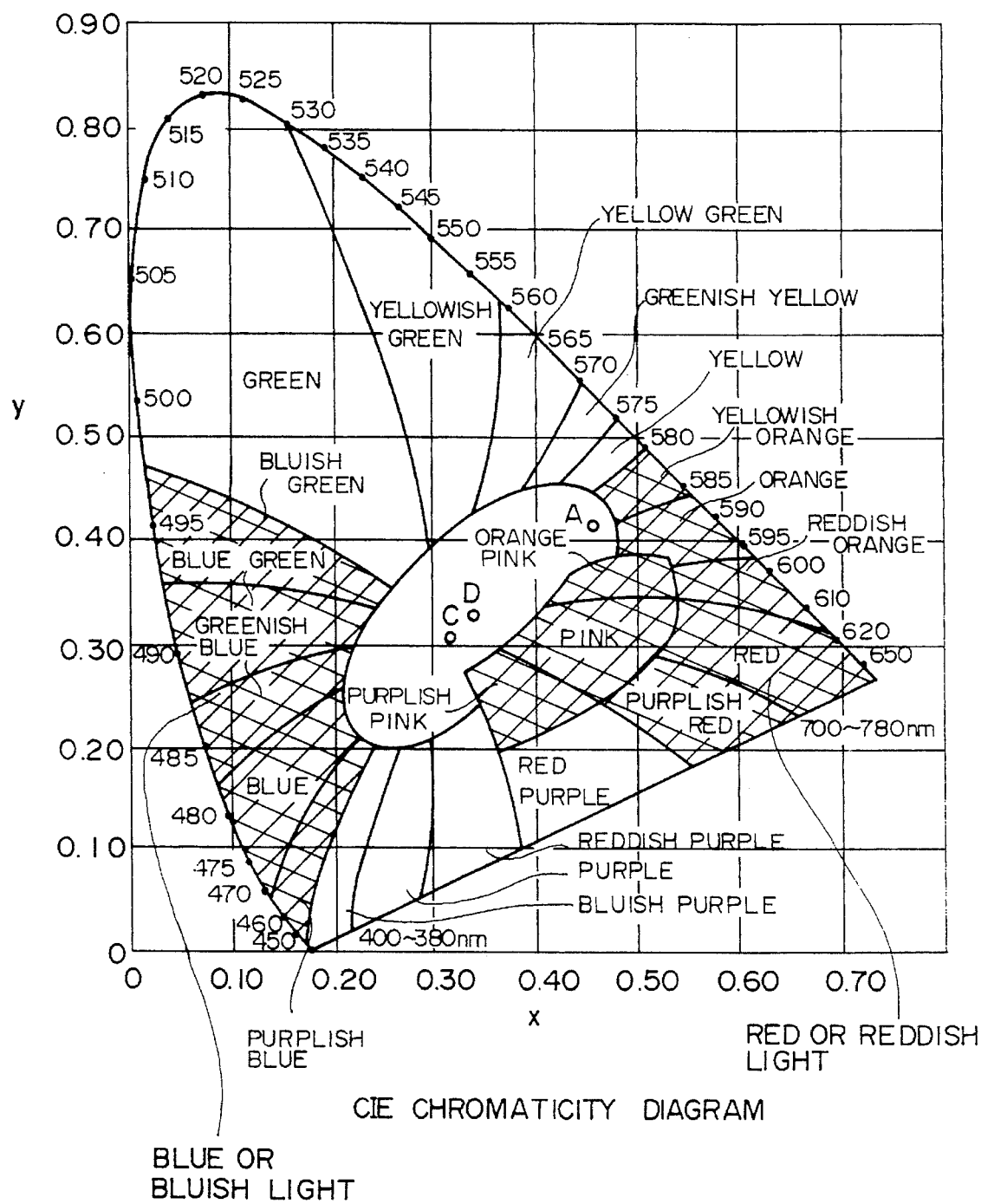
FIG. 2 is a graph showing the region defining blue or bluish light and the region defining red or reddish light on the CIE chromaticity diagram.

Arrangement can also be made in such a way that blue or bluish light is emitted from the first light emitting layer and red or reddish light is emitted from the second light emitting layer. The blue or bluish light herein is Purplish Blue, Blue, Greenish Blue, Blue Green or Bluish Green on the CIE diagram. The red or reddish light is Purplish Red, Red, Reddish Orange, Orange, Yellowish Orange, Orange Pink, Pink or Purplish Pink on the CIE diagram. More specifically, these lights are in the regions shown in FIG. 2.

The first light emitting layer may have a structure of a hole transporting layer/the first light emitting layer, as well. This laminate structure can be adopted so long as the light emitting layer satisfies the condition that a fluorescence peak wave length in solid state is in the range of 380 nm or longer to shorter than 480 nm. The organic compound having a fluorescence peak wave length of 580 nm or longer to 650 nm or shorter in solution state may be contained in the first light emitting layer of this structure.

The organic compound used in the first light emitting layer is not particularly limited. Examples of the organic compound are compounds satisfying above-mentioned condition of the fluorescence for the first light emitting layer selected from the organic compounds described in Japanese Patent Application Laid-Open No. 231970/1991, International Patent Application Laid-Open No. WO 92/05131, Japanese Patent Application No. 170354/1993 and PCT/JP93/01198. Preferable examples are combinations of compounds satisfying above-mentioned condition of the fluorescence for the first light emitting layer selected from the organic compounds described in Japanese Patent Application Laid-Open No. 231970/1991, International Patent Application Laid-Open No. WO 92/05131 and Japanese Patent Application No. 170354/1993 with suitable compounds described in PCT/JP93/01198, and compounds satisfying above-mentioned condition of the fluorescence for the first light emitting layer selected from compounds used for the hole injecting and transporting layer described later.

As the compound satisfying above-mentioned condition of the fluorescence for the first light emitting layer selected from organic compounds described in Japanese Patent Application Laid-Open No. 231970/1991 and WO 92/05131, the following compounds can be mentioned:

An aromatic methylidine compound represented by the general formula (I):

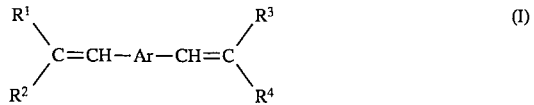

wherein $R^1$ to $R^4$ indicate each a hydrogen atom, an alkyl group having 1 to 6 carbon atoms, an alkoxy group having 1 to 6 carbon atoms, an aralkyl group having 7 to 18 carbon atoms, a substituted or unsubstituted aryl group having 6 to 18 carbon atoms, a substituted or unsubstituted aromatic heterocyclic group, a substituted or unsubstituted cyclohexyl group, a substituted or unsubstituted aryloxy group having 6 to 18 carbon atoms, or a substituted or unsubstituted pyridyl group;

therein the substituent is an alkyl group having 1 to 6 carbon atoms, an alkoxy group having 1 to 6 carbon atoms, an aralkyl group having 7 to 18 carbon atoms, an aryloxy group having 6 to 18 carbon atoms, an acyl group having 1 to 6 carbon atoms, an acyloxy group having 1 to 6 carbon atoms, carboxyl group, styryl group, an arylcarbonyl group having 6 to 20 carbon atoms, an aryloxycarbonyl group having 6 to 20 carbon atoms, an alkoxycarbonayl group having 1 to 6 carbon atoms, vinyl group, anilinocarbonyl group, carbamoyl group, phenyl group, nitro group, hydroxyl group or a halogen atom; number of the substituent may be one or plural;

$R^1$ to $R^4$ may be identical to or different from one another; $R^1$ and $R^2$, and $R^3$ and $R^4$ may be combined through substituents in one or both of them to form a substituted or unsubstituted saturated or unsaturated five-membered ring or a substituted ring or a unsubstituted saturated or unsaturated six-membered ring;

Ar indicates a substituted or unsubstituted arylene group having 6 to 20 carbon atoms; the arylene group therein may be mono-substituted or poly-substituted and its positions may be any of ortho-, para- and meta-; the substituent therein is the same as that described above; substituents in the arylene group may combine with each other to form a substituted or unsubstituted saturated or unsaturated five-membered ring or a substituted or unsubstituted saturated or unsaturated six-membered ring; and, when Ar is unsubstituted phenylene group, $R^1$ to $R^4$ are each a group selected from the group consisting of an alkoxy group having 1 to 6 carbon atoms, an aralkyl group having 7 to 18 carbon atoms, a substituted or unsubstituted naphthyl group, biphenyl group, cylclohexyl group and an aryloxy group.

An aromatic methylidine compound represented by the general formula (II):

wherein A and B indicate each a monovalent group having a structure obtained by removing one hydrogen atom from the compound represented by the general formula (I) described above and may be identical to or different from each other, and Q indicates a divalent group breaking the conjugation.

An aromatic methylidine compound represented by the general formula (III):

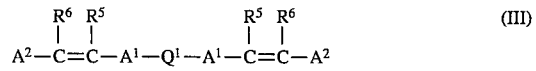

wherein $A^1$ indicates a substituted or unsubstituted arylene group having 6 to 20 carbon atoms or a substituted or unsubstituted divalent aromatic heterocyclic group and its bonding positions may be any of ortho- para- and meta-; $A^2$ indicates substituted or unsubstituted aryl group having 6 to 20 carbon atoms or a substituted or unsubstituted monovalent aromatic heterocyclic group; and $R^5$ and $R^6$ indicate each a hydrogen atom, a substituted or unsubstituted aryl group having 6 to 20 carbon atoms, cyclohexyl group, a monovalent aromatic heterocyclic group, an alkyl group having 1 to 10 carbon atoms, an aralkyl group having 7 to 20 carbon atoms, or an alkoxy group having 1 to 10 carbon atoms, and may be identical to or different from each other; therein the substituent is an alkyl group, an aryloxy group, amino group or a phenyl group having or not having these groups; number of the substituent may be one or plural;

each substituents in $R^5$ may combine with $A^1$ to form a saturated or unsaturated five-membered or six-membered ring; each substituents in $R^6$ may combine with $A^2$ to form a saturated or unsaturated five-membered or six-membered ring; and $Q^1$ indicates the same group as that described above.

$R^1$ to $R^4$ in the general formula (I) may be identical to or different from one another as described above and indicate each an alkyl group having 1 to 6 carbon atoms (such as methyl group, ethyl group, n-propyl group, isopropyl group, n-butyl group, isobutyl group, sec-butyl group, tert-butyl group, isopentyl group, t-pentyl group, neopentyl group, isohexyl group and the like), an alkoxy group having 1 to 6 carbon atoms (such as methoxy group, ethoxy group, propoxy group, butoxy group and the like), an aralkyl group having 7 to 18 carbon atoms (such as benzyl group, phenetyl group and the like), an aryl group having 6 to 18 carbon atoms (such as a phenyl group, a biphenyl group, a naphthyl group, and the like), cyclohexyl group, an aromatic heterocyclic group (such as pyridyl group, quinolyl group and the like) and an aryloxy group having 6 to 18 carbon atoms (such as phenoxy group, biphenyloxy group, naphthyloxy group and the like).

$R^1$ to $R^4$ may be groups resulted by combining the above with substituents. Specifically, $R^1$ to $R^4$ indicate each a substituent-containing phenyl group, a substituent-containing aralkyl group, a substituent-containing cyclohexyl group, a substituent-containing biphenyl group, or a substituent-containing naphthyl group. The substituent therein includes an alkyl group having 1 to 6 carbon atoms, an alkoxy group having 1 to 6 carbon atoms, an aralkyl group having 7 to 18 carbon atoms, an aryloxy group having 6 to 18 carbon atoms, an acyl group having 1 to 6 carbon atoms, an acyloxy group having 1 to 6 carbon atoms, carboxyl group, styryl group, an arylcarbonyl group having 6 to 20 carbon atoms, an aryloxycarbonyl group having 6 to 20 carbon atoms, an alkoxycarbonyl group having 1 to 6 carbon atoms, vinyl group, anilinocarbonyl group, carbamoyl group, phenyl group, nitro group, hydroxyl group or a halogen atom, and may be poly-substituted. Accordingly, for example, the substituent-containing aralkyl groups include alkyl group-substituted aralkyl groups (such methylbenzyl group, methylphenetyl group and the like), alkoxy group-substituted aralkyl groups (such as methoxybenzyl group, ethoxyphenetyl group, and the like). aryloxy group-substituted aralkyl groups (such as phenoxybenzyl group, naphthyloxyphenetyl group and the like), and phenyl group-substituted aralkyl groups (such as phenylphenetyl group and the like). Above-mentioned substituent-containing phenyl groups include alkyl group-substituted phenyl groups (such as tolyl group, dimethylphenyl group, ethylphenyl group and the like), alkoxy group-substituted phenyl groups (such as methoxyphenyl group, ethoxyphenyl group and the like), aryloxy group-substituted phenyl groups (such as phenoxyphenyl group, naphthyloxyphenyl group and the like) and phenyl group-substituted phenyl group (biphenyl group). The substituentocontaining cyclohexyl groups include alkyl group-substituted cyclohexyl groups (such as methylcylohexyl group, dimethylcyclohexyl group, ethylcyclohexyl group and the like), alkoxy group-substituted cyclohexyl groups (such as methoxycyclohexyl group, ethoxycyclohexyl group and the like), aryloxy group-substituted cyclohexyl groups (such as phenoxycyclohexyl group, naphthyloxycyclohexyl group and the like), and phenyl group-substituted cyclohexyl group (phenylcyclohexyl group). The substituent-containing naphthyl groups include alkyl group-substituted naphthyl groups (such as methylnaphthyl group, dimethylnaphthyl group and the like), alkoxy group-substituted naphthyl groups (such as methoxynaphthyl group, ethoxynaphthyl group and the like), aryloxy group-substituted naphthyl groups (such as phenoxynaphthyl group, naphthyloxynaphthyl group and the like), and phenyl group-substituted naphthyl group (phenylnaphthyl group).

$R^1$ to $R^4$ indicate each preferably an alkyl group having 1 to 6 carbon atoms, an aryloxy group, phenyl group, naphthyl group, biphenyl group or cyclohexyl group among the above groups. They may be substituted or unsubstituted. $R^1$ to $R^4$ may be identical to or different from one another. $R^1$ and $R^2$, and $R^3$ and $R^4$ may be combined through a substituent in one or both of them to form a substituted or unsubstituted saturated or unsaturated five-membered ring or a substituted or unsubstituted saturated or unsaturated six-membered ring.

On the other hand, Ar in the general formula (I) indicates an arylene group having 6 to 20 carbon atoms, that is, an arylene group, such as a substituted or unsubstituted phenylene group, biphenylene group, p-terphenylene group, naphthylene group, terphcnylene group, naphthalenediyl group, anthrathenediyl group, phenanthrenediyl group, phenylenediyl group or the like. The arylene group may be substituted or unsubstituted. The position of methylidine group (=C=CH—) may be any of ortho-, recta- and para-. However, when Ar is an unsubstituted phenylene group, $R^1$ to $R^4$ indicate each a group selected from the group consisting of an alkoxy group having 1 to 6 carbon atoms, an aralkyl group having 7 to 18 carbon atoms, a substituted or unsubstituted naphthyl group, biphenyl group, cyclohexyl group, and an aryloxy group. The substituent therein includes an alkyl group (such as methyl group, ethyl group, n-propyl group, isopropyl group, n-butyl group, isobutyl group, sec-butyl group, t-butyl group, isopentyl group, t-pentyl group, neopentyl group, isohexyl group and the like), an alkoxy group (such as methoxy group, ethyoxy group, propoxy group, isopropoxy group, butyloxy group, isobutyloxy group, sec-butyloxy group, t-butyloxy group, isopentyloxy group, t-pentyloxy group and the like), an aryloxy group (such as phenoxy group, naphthyloxy group and the like), an acyl group (such as formyl group, acetyl group, propionyl group, butyryl group and the like), an acyloxy group, an aralkyl group (such as benzyl group, phenetyl group, and the like), phenyl group, hydroxyl group, carboxyl group, anilinocarbonyl group, carbamoyl group, aryloxycarbonyl group, methoxycarbonyl group, ethoxycarbonyl group butoxycarbonyl group, nitro group and a halogen atom, and may be mono-substituted or poly-substituted.

The methylidine aromatic compound represented by the general formula (I) described above contains two methylidine groups (=C=CH—) in one molecule, varying in four combinations according to the geometrical isomerism of said methylidine unit, that is, cis-cis, transcis, cis-trans and trans-trans. The first light emitting layer in the EL device of the present invention may contain any of these combinations of isomers. It may contain a mixture of these combinations, as well. Particularly preferred one contains the trans isomer alone.

The substituents described above may combine with one another to form a substituted or unsubstituted saturated or unsaturated five-membered or six-membered ring.

A and B in the general formula (II) indicate each a monovalent group having a structure obtained by removing a hydrogen atom from the compound expressed by-the general formula (I) mentioned above and may be identical to or different from each other. Therein, Q in the general formula (II) indicates a divalent group breaking a conjugation.

The conjugation therein is attributed to delocalization of π-electrons. It includes conjugated double bonds and a conjugation due to unpaired electrons or lone pair electrons. Specific examples of Q are:

$-CH_2-$,  $-CH_2CH_2-$, $-\underset{CH_3}{\underset{|}{CH}}-CH_2-$,  $CH_3-\underset{CH_3}{\overset{|}{\underset{|}{C}}}-CH_3$, $-CH_2CH_2CH_2-$,
$-O-$,  $-O-CO-O-$,
$-OCH_2CH_2O-$,
$-CO-CO-$,
$-COCH_2CO-$,
$-CO(CH_2)_2CO-$,

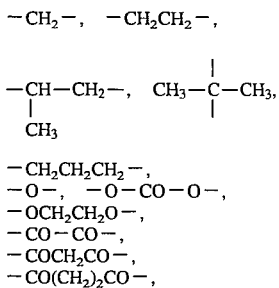

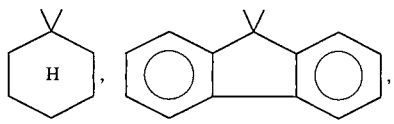

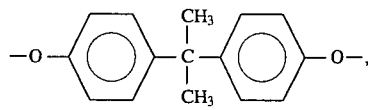

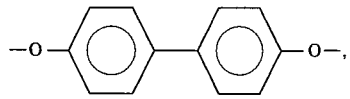

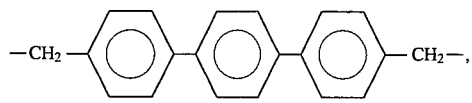

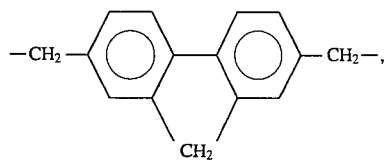

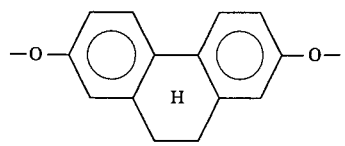

The divalent group breaking the conjugation is thus used for the purpose that the EL emission light obtained when A or B shown in the above (that is, the compound of general formula (I)) is used solely as the organic EL device of the present invention and the EL emission light obtained when the compound represented by general formula (II) is used as the organic EL device of the present invention are identical in color. In other words, said divalent group is used so that shift of wave length of light from the first light emitting layer represented by the general formula (I) or the general formula (II) to a shorter or longer wave length is avoided. By combining with a divalent group to break conjugation, it is confirmed that glass transition temperature (Tg) rises, and uniform pinhole-free minute crystal or amorphous thin film can be obtained, improving the uniformity of light emission. Further, combining with a divalent group breaking the conjugation brings about advantages that shift of EL emission light to a longer wave length can be avoided and that synthesis or purification can be easily effected.

$A^1$ in the general formula (III) indicates a substituted or unsubstituted arylene group having 6 to 20 carbon atoms or a substituted or unsubstituted divalent aromatic heterocyclic group and $A^2$ indicates a substituted or unsubstituted aryl group having 6 to 20 carbon atoms (such as phenyl group, biphenyl group, naphthyl group and the like) or a substituted or unsubstituted monovalent aromatic heterocyclic group. $R^5$ and $R^6$ indicate each a hydrogen atom, a substituted or unsubstituted aryl group having 6 to 20 carbon atoms, cyclohexyl group, a monovalent aromatic heterocyclic group, an alkyl group having 1 to 10 carbon atoms (such as methyl group, ethyl group, n-propyl group, isopropyl group, n-butyl group, isobutyl group, sec-butyl group, tert-butyl group, isopentyl group, t-pentyl group, neopentyl group, isohexyl group and the like), an aralkyl group having 7 to 20 carbon atoms (such as benzyl group, phenetyl group and the like), or an alkoxy group having 1 to 10 carbon atoms (such as methoxy group, ethoxy group, propoxy group, butoxy group and the like). $R^5$ and $R^6$ may be identical to or different from each other. The substituent therein is an alkyl group, an aryloxy group, an amino group or a phenyl group having or not having these groups. Number of the substituent may be one or plural. Each substituents in $R^5$ may combine with $A^1$ to form a saturated or unsaturated five-membered or six-membered ring, and similarly each substituents in $R^6$ may combine with $A^2$ to form a saturated or unsaturated five-membered or six-membered ring. $Q^1$ indicates a group breaking a conjugation as described above. The bonding positions of $A^1$ may be any of ortho-, para- and meta-.

Further, in the present invention, the organic compound represented by the general formula (I), (II) or (III) must be a compound providing an emission of bluish purple, purplish blue, blue, greenish blue or bluish green light on the CIE chromaticity diagram.

More specific examples of the organic compound represented by the general formula (I), (II) or (III) are shown in the following:

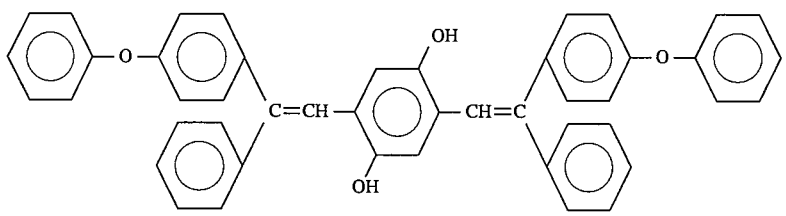

-continued
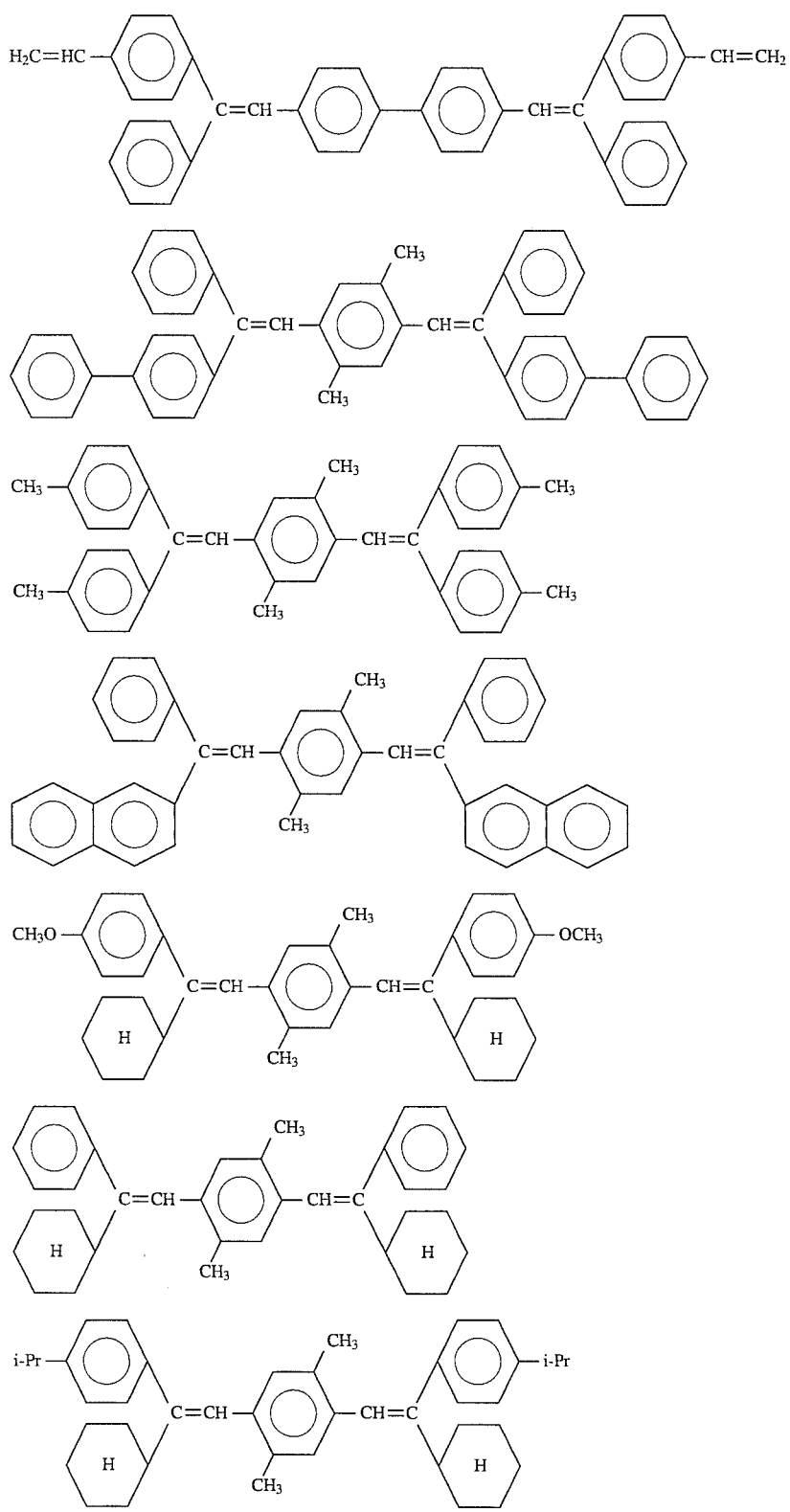
i-Pr: isopropyl group; the same in the compounds shown below.

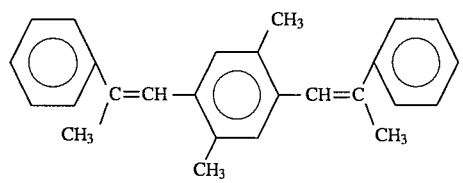
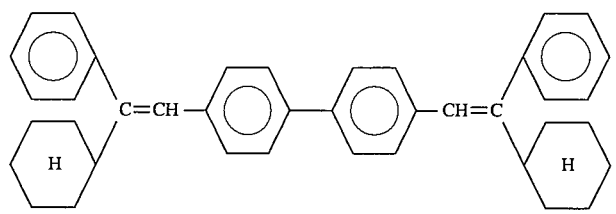
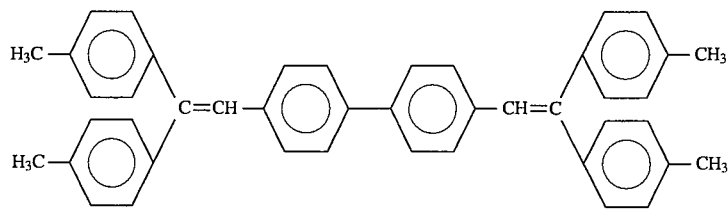
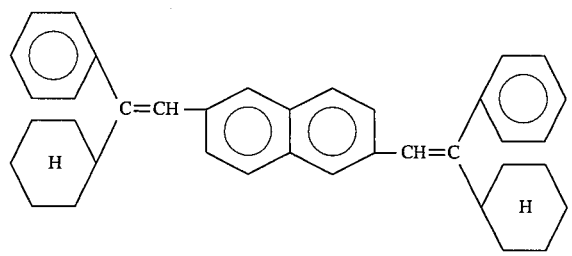
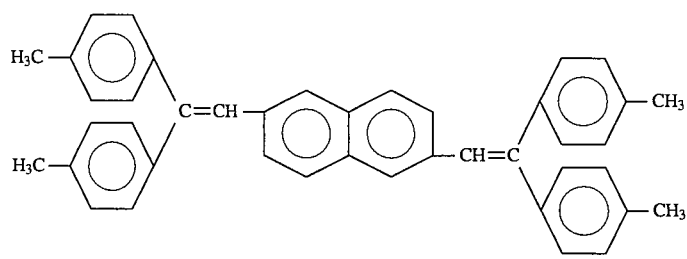
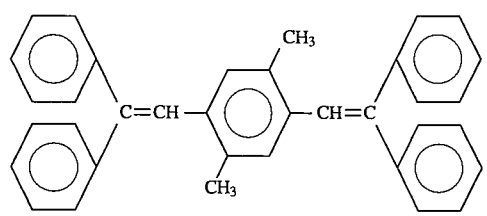
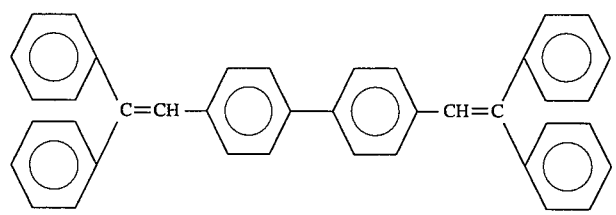

-continued
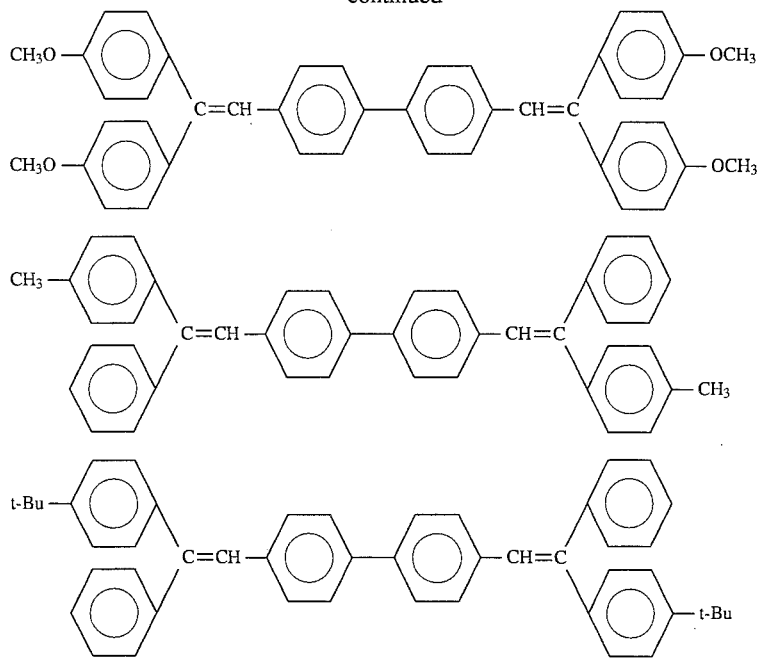
t-Bu: t-butyl group; the same in the compounds shown below.

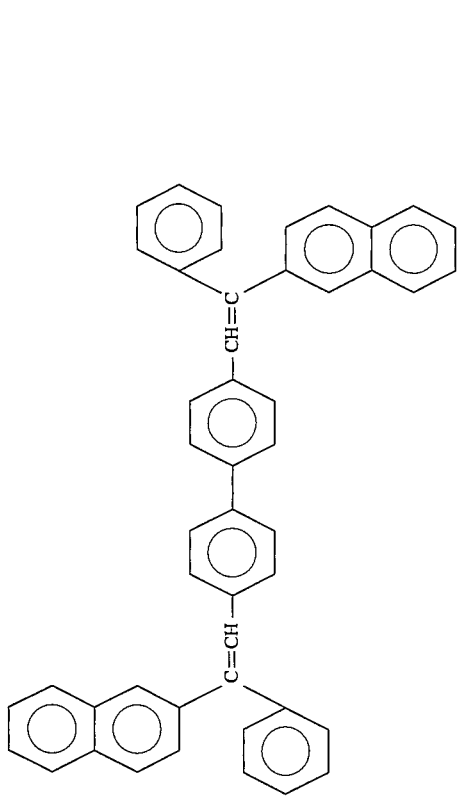
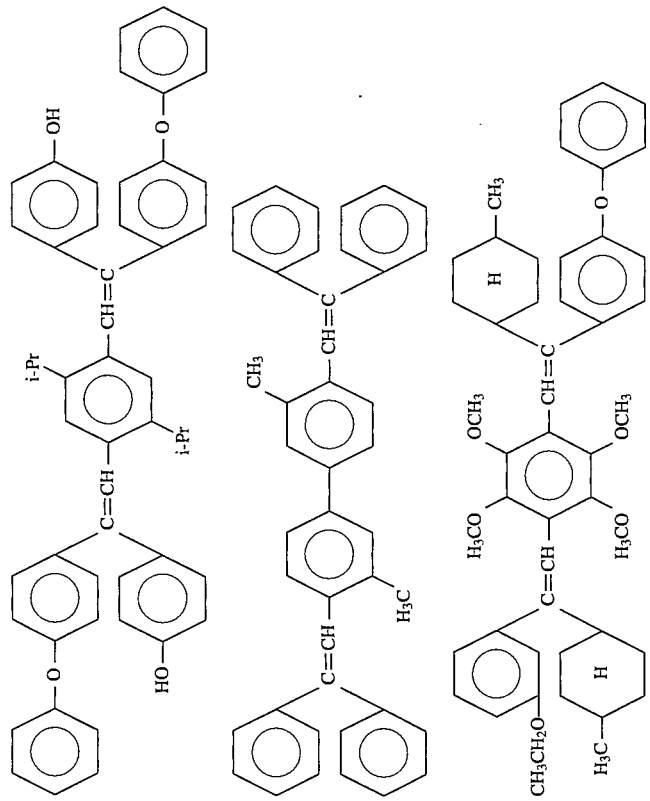
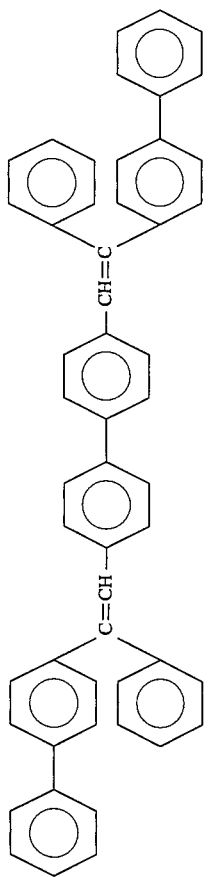
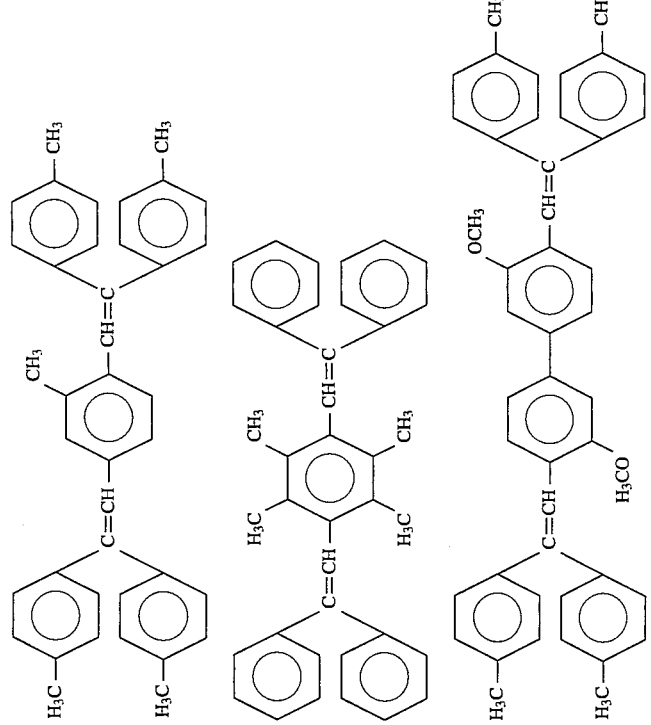

-continued
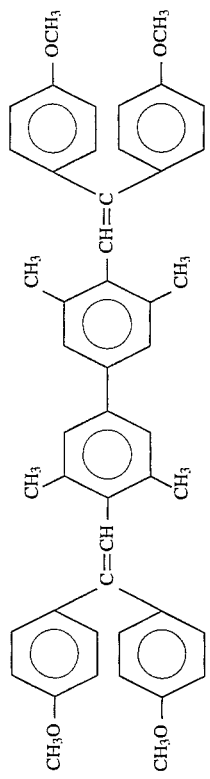
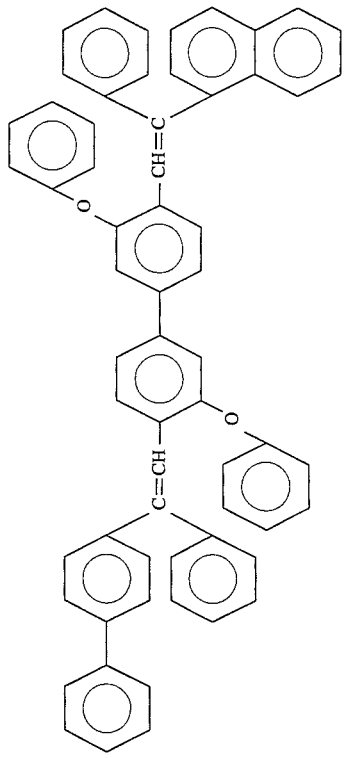
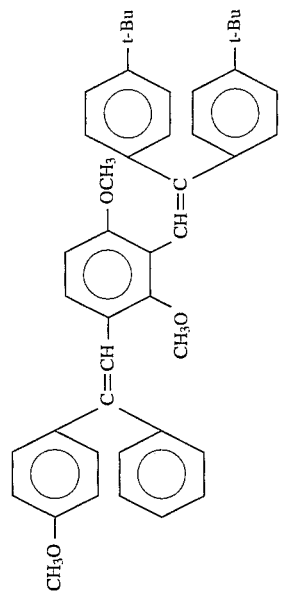
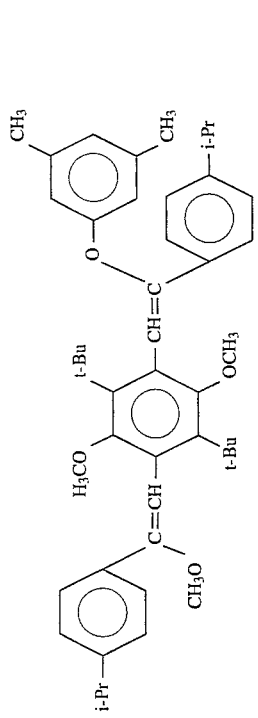
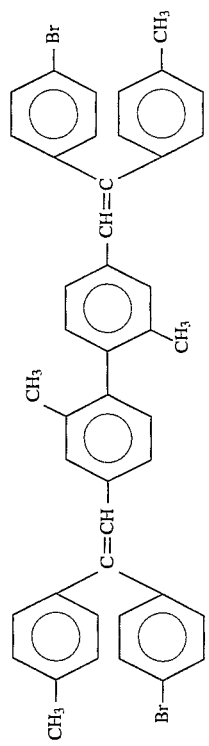
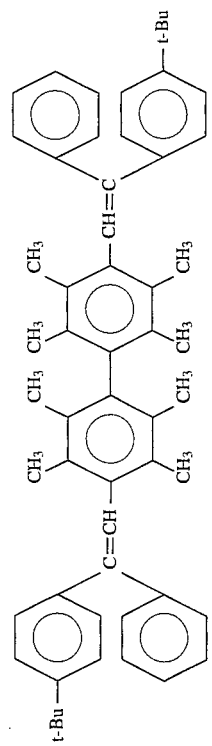

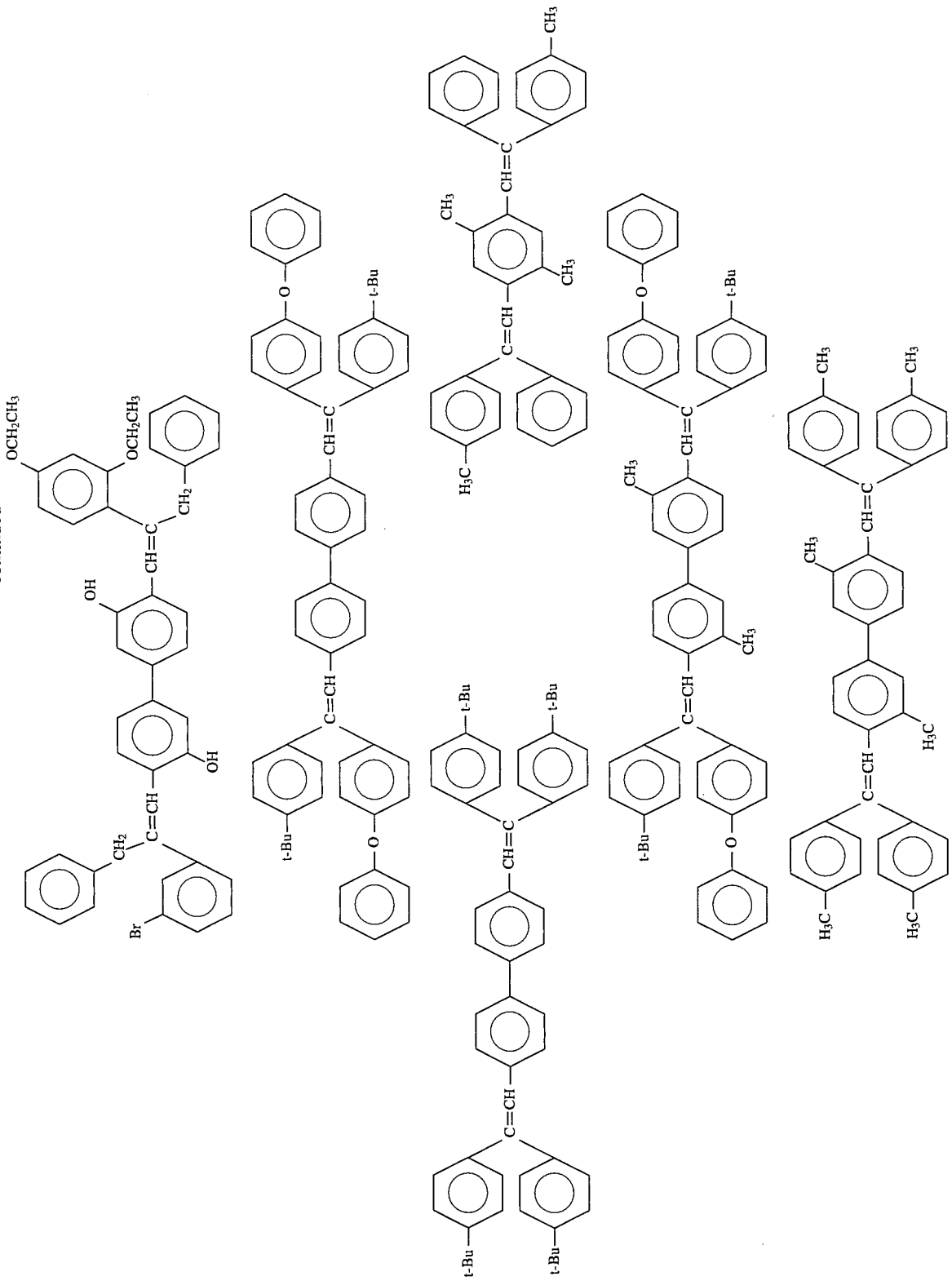

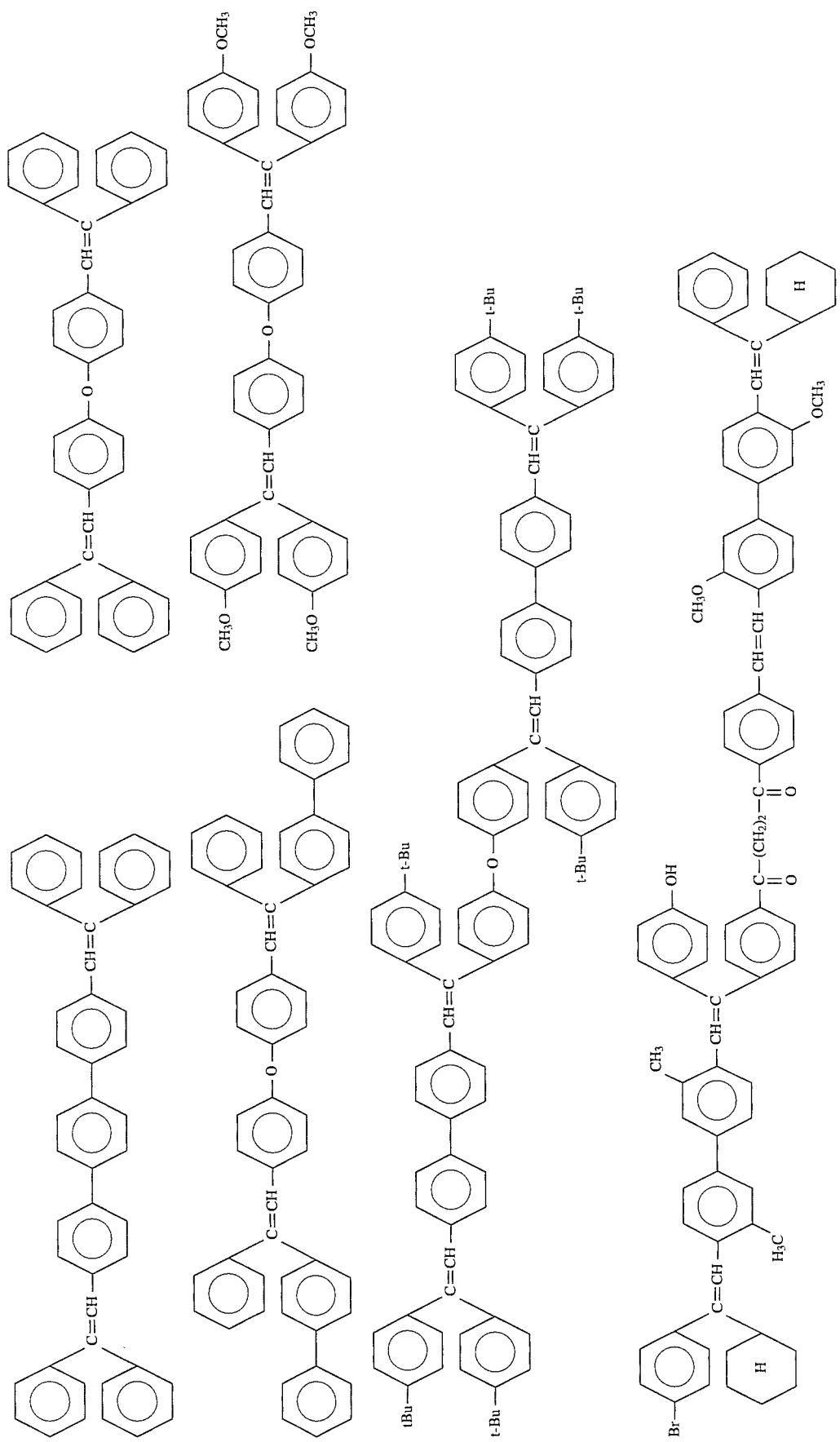

-continued
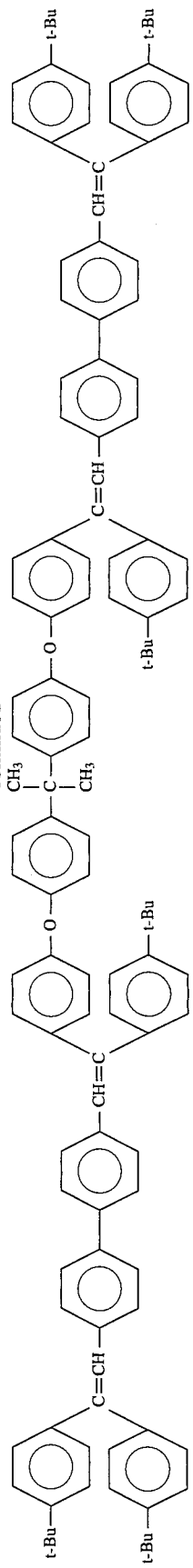
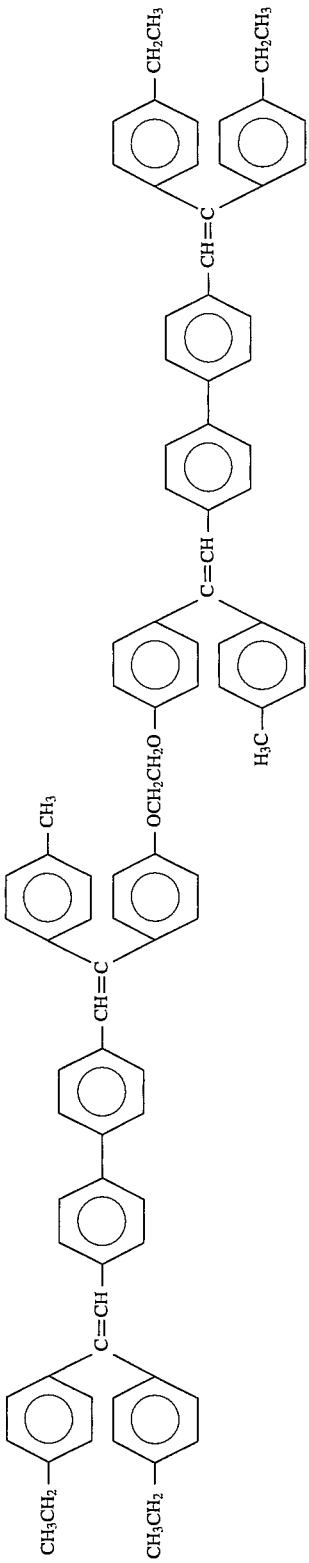
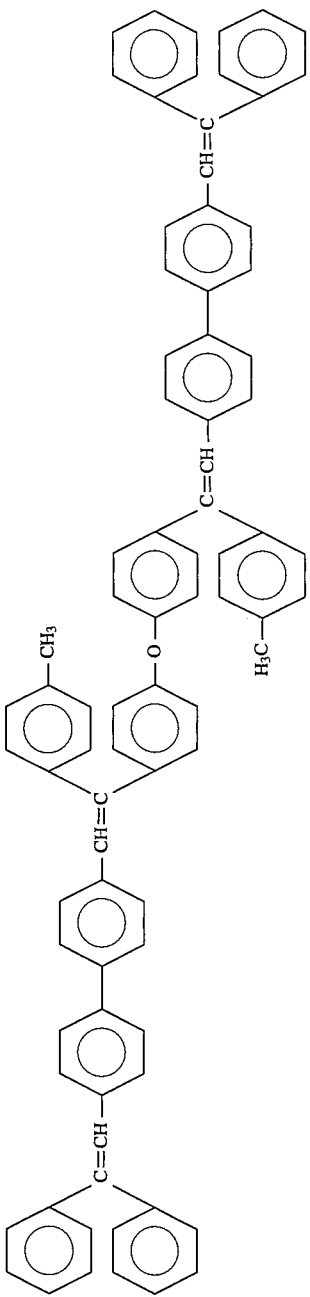

Still another preferable examples of the organic compounds are the following compounds:

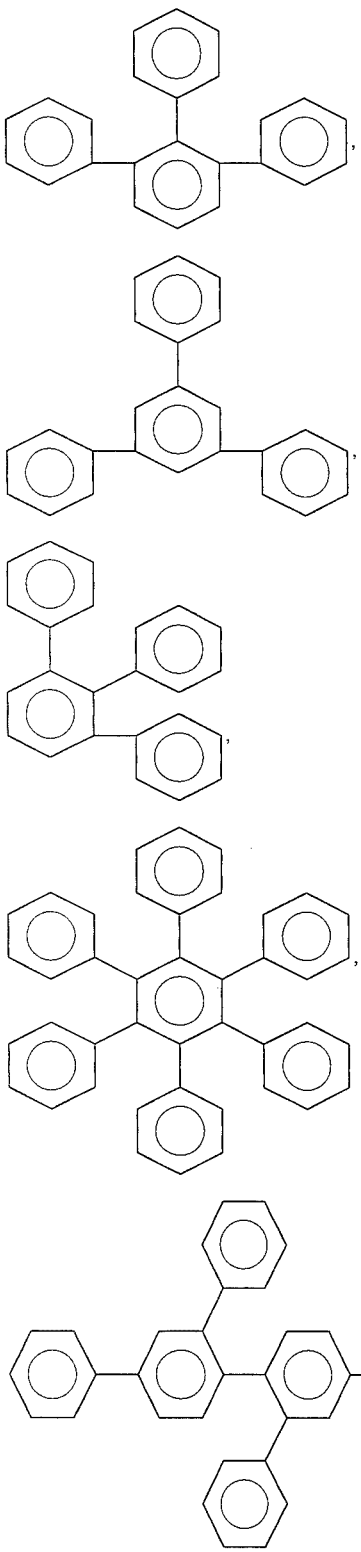

and aluminum chelate compositions containing a substituted 8-quinolinolate ligand providing an emission of bluish light which are described in Japanese Patent Application Laid-Open Nos. 198377/1993, 198378/1993 and 214332/1993.

Still other examples of the compound satisfyinhg a fluorescence condition of the first light emitting layer described above are styryl compounds of terphenylene derivatives respresented by the following general formula (XI):

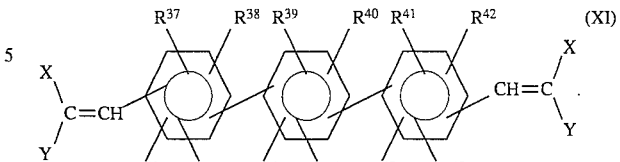

In the above general formula, $R^{37}$ and $R^{48}$ are each independently a hydrogen atom or an alkyl group having 1 to 6 carbon atoms. Therein, at least one of $R^{37}$ to $R^{48}$ is an alkyl group having 1 to 6 carbon atoms. $R^{38}$ and $R^{39}$, $R^{40}$ and $R^{41}$, $R^{44}$ and $R^{45}$, and $R^{46}$ and $R^{47}$ may combine with each other to form each a saturated or unsaturated five-membered or six-membered ring. X and Y indicate each independently a substituted or unsubstituted aryl group having 6 to 20 carbon atoms. X and Y may each combine with a substituent to form a substituted or unsubstituted saturated or unsaturated five-membered or six-membered ting.

The substituent therein is an alkyl group having 1 to 6 carbon atoms, an alkoxy group having 1 to 6 carbon atoms, an aryloxy group having 6 to 18 carbon atoms, phenyl group, amino group, cyano group, nitro group, hydroxyl group or a halogen atom. Number of the substituent may be one or plural.

$R^{37}$ to $R^{48}$ in the general formula (XI) indicate each independently a hydrogen atom or an alkyl group having 1 to 6 carbon atoms, such as methyl group, ethyl group, n-propyl group, isopropyl group, n-butyl group, isobutyl group, sec-butyl group, t-butyl group, isopentyl group, t-pentyl group, neopentyl group, n-hexyl group, isohexyl group and the like. Therein, at least one of $R^{37}$ to $R^{48}$ is an alkyl group having 1 to 6 carbon atoms, and preferably methyl group or ethyl group. $R^{38}$ and $R^{39}$, $R^{40}$ and $R^{41}$, $R^{44}$ and $R^{45}$, and $R^{46}$ and $R^{47}$ may combine with each other each to form a saturated or unsaturated five-membered or six-membered ring. Examples of the styryl compound having saturated or unsaturated five-membered or six-membered ting are, when saturated rings are formed with $R^{38}$ and $R^{39}$, and $R^{46}$ and $R^{47}$, the following compound:

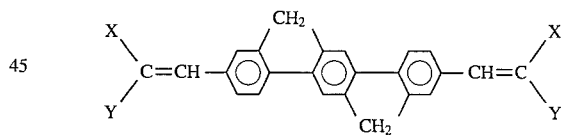

and the like and, when a saturated ring is formed with $R^{46}$ and $R^{47}$, the following compound:

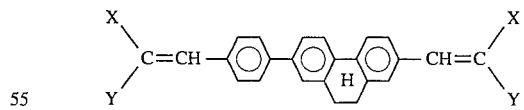

and the like.

X and Y indicate each independently an aryl group having 6 to 20 carbon atoms, such as phenyl group, naphthyl group, biphenyl group, terphenyl group, anthranyl group, phenanthryl group, pyrenyl group, perrylenyl group and the like, each with or without substituents.

The substituent therein is, for example, an alkyl group having 1 to 6 carbon atoms, such as methyl group, ethyl group, n-propyl group, isopropyl group, n-butyl group, isobutyl group, sec-butyl group, t-butyl group, isopehtyl group, t-pentyl group, neopentyl group, n-hexyl group, isohexyl group and the like, an alkoxy group having 1 to 6 carbon atoms, such as methoxy group, ethoxy group, n-propoxy group, isopropoxy group, n-butyloxy group, isobutyloxy group, sec-butyloxy group, isopentyloxy group, t-pentyloxy group, n-hexyloxy group and the like, aryloxy group having 6 to 18 carbon atoms, such as phenoxy group, naphthyloxy group and the like, phenyl group, amino group, cyano group, nitro group, hydroxyl group or a halogen atom. Number of the substituent may be one or plural.

X and Y may each combine with a substituent to form a substituted or unsubstituted saturated or unsaturated five-membered or six-membered ring. Examples of the styryl compound having a saturated or unsaturated five-membered or six-membered ring are, when X and Y form saturated five-membered tings, the following compound:

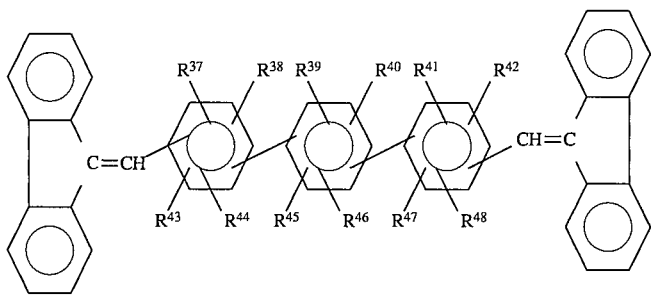

and the like, and, when X and Y form saturated six-membered rings, the following compound:

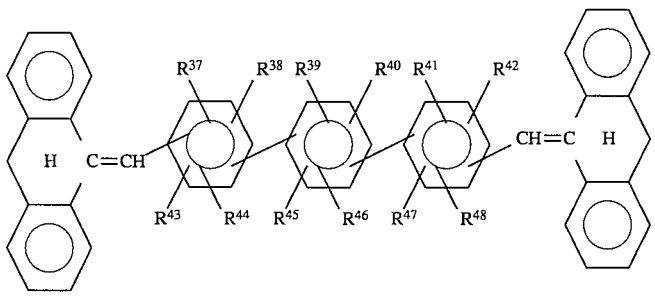

and the like.

The styryl compound represented by the general formula (XI) described above can be prepared by various conventional methods. Specifically, the following two methods are mentioned:

Method 1

The styryl compound can be synthesized by condensation of a phosphonic acid ester represented by the following general formula (a):

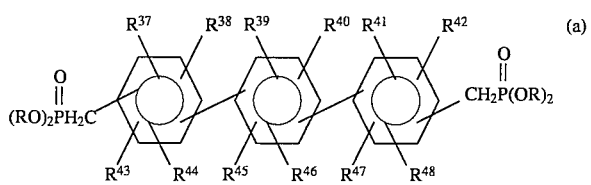

wherein R indicates an alkyl group having 1 to 4 carbon atoms or a phenyl group and $R^{37}$ to $R^{48}$ indicate the same groups as those described above, and a carbonyl compound represented by the following general formula (b):

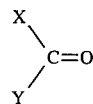 (b)

wherein X and Y indicate the same groups as those described above, in the presence of a base (Witfig reaction or Wittig-Horner reaction).

Method 2

The styryl compound can be synthesized by condensation of an dialdehyde compound represented by the following general formula (c):

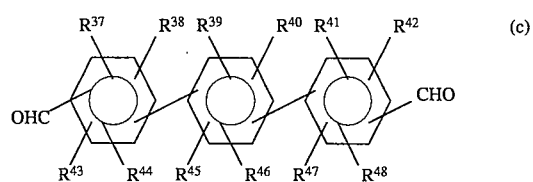

wherein $R^{37}$ to $R^{48}$ indicate the same groups as those described above, and a phosphonic acid ester represented by the following general formula (d):

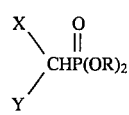 (d)

wherein R, X and Y indicate the same groups as those described above, in the presence of a base (Wittig reaction or Wittig-Horner reaction).

The solvent used in these reactions is preferably a hydrocarbon, an alcohol or an ether or, more specifically, methanol, ethanol, isopropanol, butanol, 2-methoxyethanol, 1,2- dimethoxyethane, bis(2-methoxyethyl) ether, dioxane, tetrahydrofuran, toluene, xylene, dimethylsulfoxide, N,N-dimethylformamide, N-methylpyrrolidone, 1,3-dimethyl-2-imidazolidinone or the like. Tetrahydrofuran and dimethylsulfoxide are particularly preferable.

The condensation agent is preferably sodium hydroxide, potassium hydroxide, sodium amide, sodium hydride, n-butyllithium, sodium methylate, potassium t-butoxide or the like. n-Butyllithium and potassium t-butoxide are particularly preferable.

Reaction temperature is different depending on the kind of materials used for the reaction and other conditions and cannot be unconditionally defined. It can be generally in a wide range of 0° C. to about 100° C. and preferably in the range of 0° C. to room temperature.

Specific examples (1) to (26) of the styryl compound used in the present invention described above are shown in the following. However, the styryl compound of the present invention is not limited to these examples.

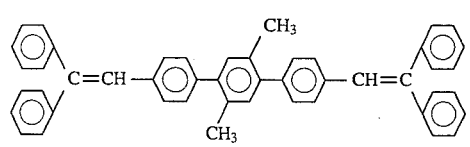
(1)

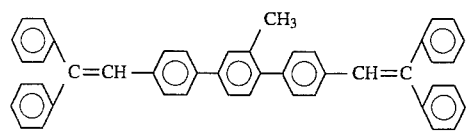
(2)

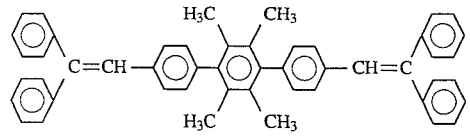
(3)

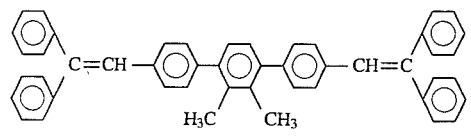
(4)

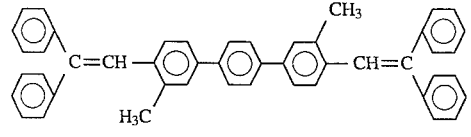
(5)

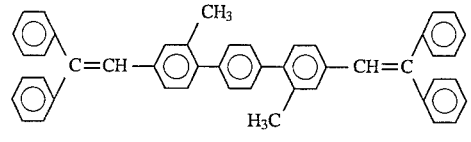
(6)

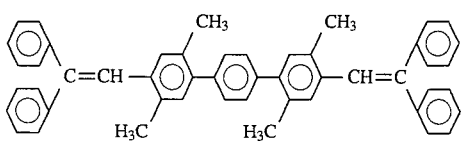
(7)

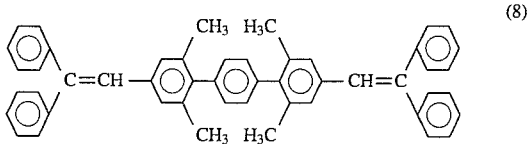
(8)

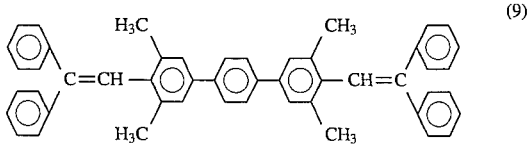
(9)

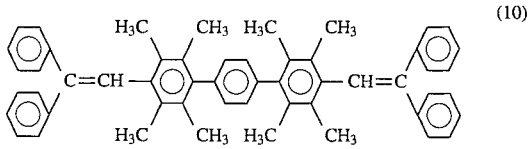
(10)

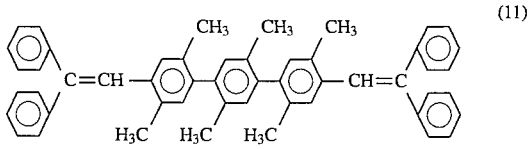
(11)

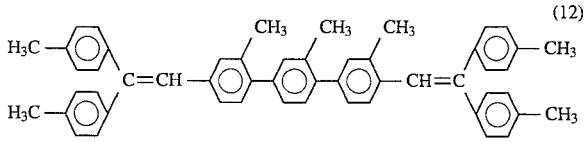
(12)

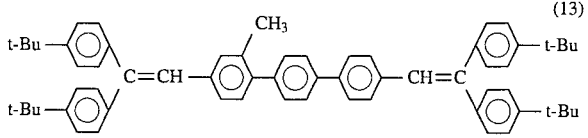
(13)

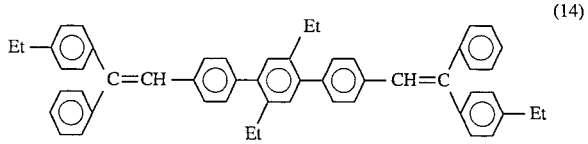
(14)

Et: ethyl group; the same in the compounds described below.

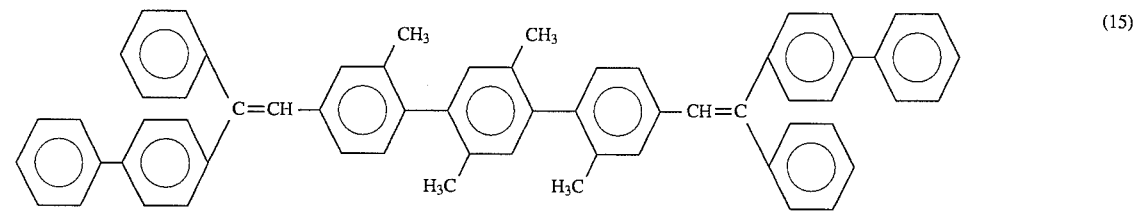
(15)

-continued
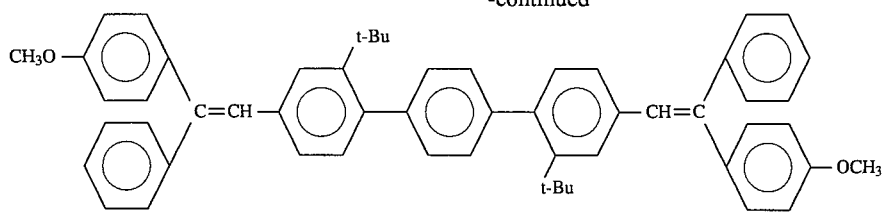
(16)
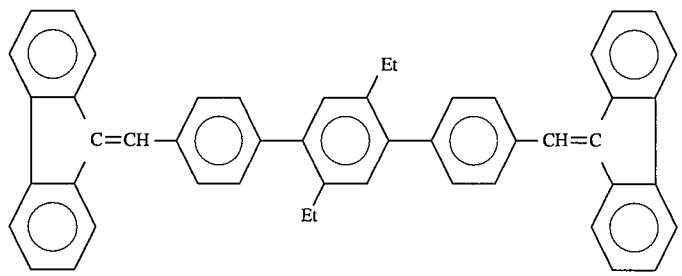
(17)
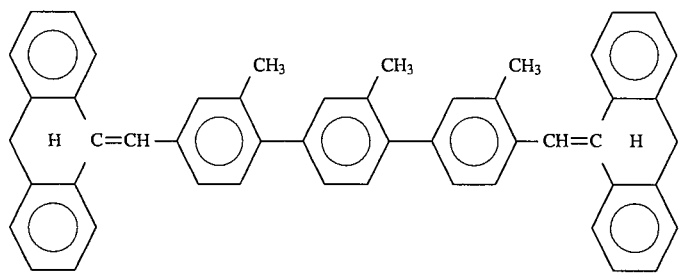
(18)
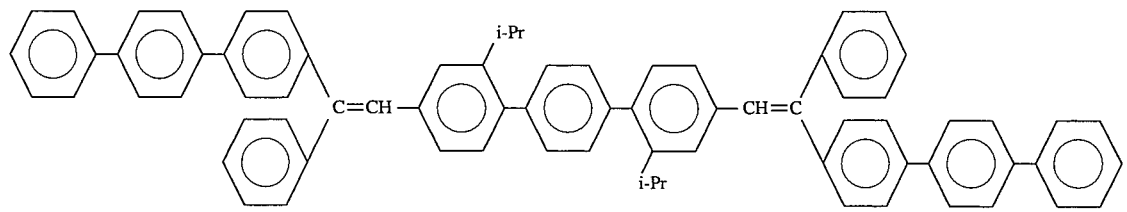
(19)
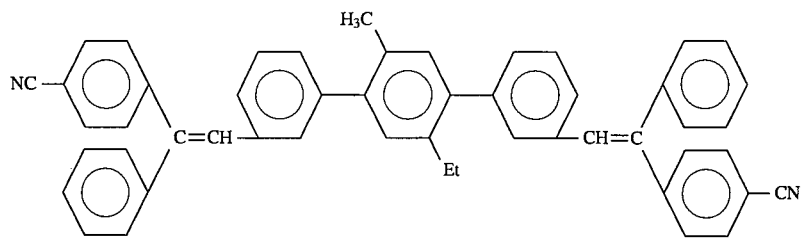
(20)
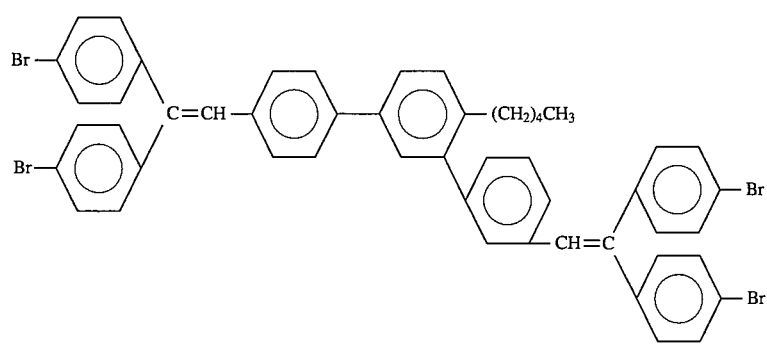
(21)

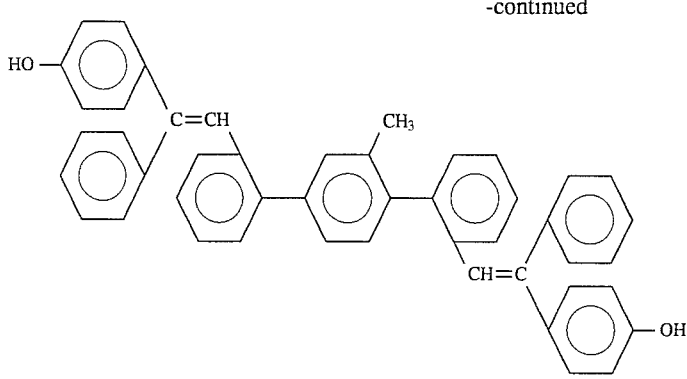
(22)
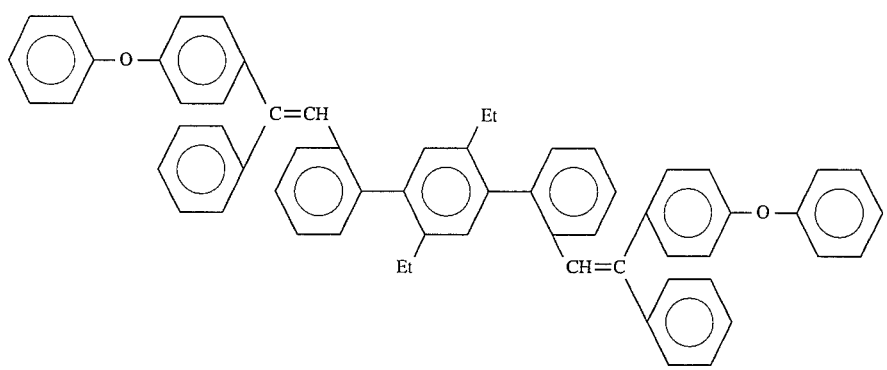
(23)
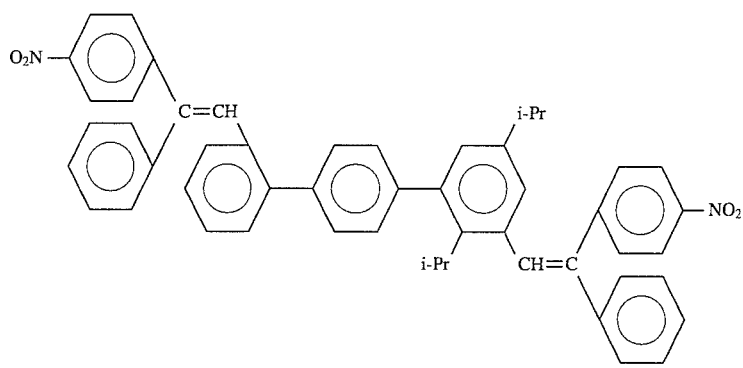
(24)
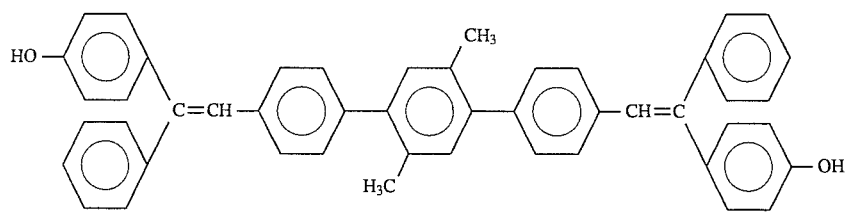
(25)
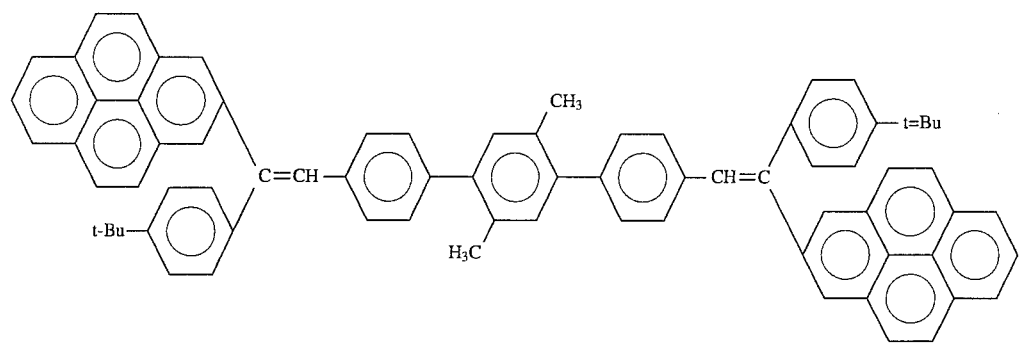
(26)

The organic compound having a fluorescence peak wave length of 480 nm or longer to shorter than 580 nm in solid state which is used in the second light emitting layer is not particularly limited and, for example, coumarin derivatives used as laser color elements which are described in European Patent Application Laid-Open No. 012281381 can be used. The coumarin derivatives are more specifically the following compounds:

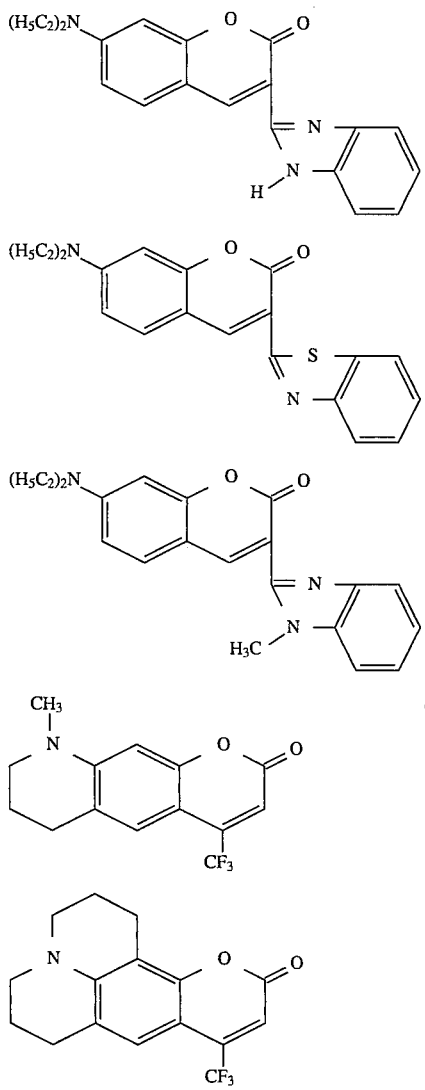

and the like compounds. Compounds satisfying above-mentioned conditions of fluorescence in the second light emitting layer selected from the organic compounds described in Japanese Patent Application 31970/1991 or in WO 92/05131 can be used as well.

Other preferable examples of the compound are metal complexes of 8-hydroxyquinoline and derivatives thereof. Specifically, metal chelated oxinoid compounds including chelates of oxine (generally, 8-quinolinol or 8-hydroxyquinolinol) can be mentioned. These compounds exhibit high level properties and are easy to be formed into thin film. Examples of the oxinoid compound are compounds satisfying the following formula:

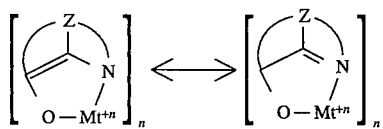

wherein Mt indicates a metal, n is an integer of 1 to 3 and Z indicates an atom required to complete at least two condensed aromatic rings, being located independently.

Therein, the metal represented by Mt can be a monovalent, divalent or trivalent metal, and is, for example, an alkali metal, such as lithium, sodium, potassium and the like, an alkaline earth metal, such as magnesium, calcium and the like, or an earth metal, such as boron, aluminum and the like.

Any of monovalent, divalent and trivalent metals which are generally known in useful chelated compounds can be used therein.

Z indicates an atom to form a hetero ring comprising azole or azine as one of at least two condensed aromatic rings. Herein, if necessary, another ring can be added to above-mentioned condensed aromatic ring. Moreover, in order to avoid adding bulky molecule without improvement in function, the number of the atom shown by Z is preferably kept to not more than 18.

Further, specific examples of the chelated oxinoid compound are tris(8-quinolinol) aluminum, bis(8-quinolinol) magnesium, bis(8-quinolinol) zinc, bis(2-methyl-8oquinolinol) zinc, bis(benzo-8-quinolinol) zinc, bis(2-methyl-8-quinolilato) aluminum oxide, tris(8-quinolinol) indium, tris(5-methylo8-quinolinol) aluminum, 8-quinolinol lithium, tris(5-chloro-8-quinolinol) gallium, tris(2-methyl-8-quinolinol) gallium, bis(5-chloro-8-quinolinol) calcium, 5,7-dichloro-8-quinolinol aluminum, tris(5,7-dibromo-8-hydroxyquinolinol) aluminum, tris(7-propyl-8-quinolinol) aluminum, bis(8-quinolinol) berillium, bis(2-methyl-8-quinolinol) berillium and the like.

In the organic EL device of the present invention, it is preferred that the first light emitting layer and/or the second light emitting layer described above contain at least one compound selected from stilbene derivatives, distyrylarylene derivatives and trisstyrylarylene derivatives described in PCT/JP/01198 in such a manner to satisfy the condition of the first light emitting layer or the second light emitting layer.

Said stilbene derivative is a compound comprising at least two aromatic rings, having a structure in which the aromatic rings are combined through a vinyl group or a substituted vinyl group and comprising an electron-donating group in either the aromatic group or the vinyl group.

Said distyrylarylene derivative is a compound having a structure in which two aromatic rings are connected to one arylene group through a vinyl group or a substituted vinyl group and comprising an electron-donating group.

Said trisstyrylarylene derivative is a compound having a structure in which three aromatic rings are connected to one trivalent aromatic ring through a vinyl group or a substituted vinyl group and comprising an electron-donating group.

In above-mentioned derivatives having an electron-donating group in the molecular skeleton, said electron-donating group is preferably an alkoxy group having 1 to 10 carbon atoms, an aryloxy group having 6 to 10 carbon atoms or an amino group containing a hydrocarbon group having 1 to 30 carbon atoms.

Particularly preferable examples of above-mentioned derivatives are compounds represented by the general formulae (IV) to (X) described in the following, wherein the general formulae (IV) and (V) show stilbene derivatives, the general formulae (VI) and (VII) show distyrylarylene derivatives and the general formulae (VIII) to (X) show trisstyrylarylene derivatives.

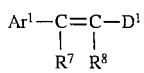 (IV)

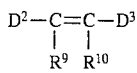 (V)

In the above formulae, $Ar^1$ indicates an aryl group having 6 to 20 carbon atoms, $R^7$ to $R^{10}$ indicate each independently a hydrogen atom or an aryl group having 6 to 20 carbon atoms, and $D^1$ to $D^3$ indicate each independently an aryl group having 6 to 20 carbon atoms and substituted with an electron-donating group or a condensed polycyclic group having 10 to 30 carbon atoms and substituted with an electron-donating group; therein $Ar^1$ and $R^7$ to $R^{10}$ may be each independently unsubstituted or substituted with an alkyl group having 1 to 10 carbon atoms, an alkoxy group having 1 to 10 carbon atoms, an aryloxy group having 6 to 10 carbon atoms, an aralkyl group having 6 to 10 carbon atoms or an amino group containing hydrocarbon groups having 1 to 20 carbon atoms. The substituents may combine with each other to form a saturated or unsaturated five-membered or six-membered ring.

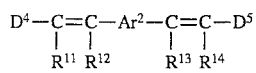 (VI)

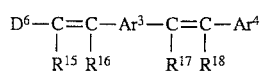 (VII)

In the above formulae, $Ar^2$ and $Ar^3$ indicate each independently an arylene group having 6 to 20 carbon atoms, $Ar^4$ indicates an aryl group having 6 to 20 carbon atoms, $R^{11}$ to $R^{18}$ indicates each independently a hydrogen atom or an aryl group having 6 to 20 carbon atoms; therein $Ar^2$ to $Ar^4$ and $R^{11}$ to $R^{18}$ may be each independently unsubstituted or substituted with an alkyl group having 1 to 10 carbon atoms, an alkoxy group having 1 to 10 carbon atoms, an aryloxy group having 6 to 10 carbon atoms, an aralkyl group having 6 to 10 carbon atoms or an amino group containing hydrocarbon groups having 1 to 20 carbon atoms. The substituents may combine with each other to form a saturated or unsaturated five-membered or six-membered ring. $D^4$ to $D^6$ indicate each independently an aryl group having 6 to 20 carbon atoms and substituted with an electron-donating group or a condensed polycyclic group having 10 to 30 carbon atoms and substituted with an electron-donating group.

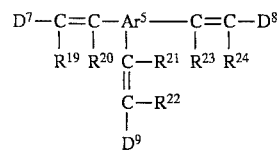 (VIII)

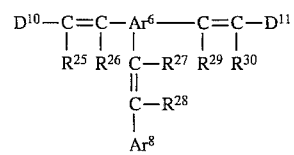 (IX)

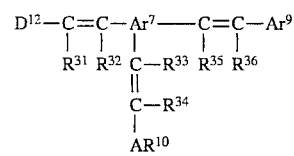 (X)

In the above formulae, $Ar^5$ to $Ar^7$ indicate each independently a trivalent aromatic ring group having 6 to 24 carbon atoms, $Ar^8$ to $Ar^{10}$ indicate each independently an aryl group having 6 to 20 carbon atoms, $R^{19}$ to $R^{36}$ indicate each independently a hydrogen atom or an aryl group having 6 to 20 carbon atoms, and $D^7$ to $D^{12}$ indicate each independently an aryl group having 6 to 20 carbon atoms and substituted with an electron-donating group or a condensed polycyclic group having 10 to 30 carbon atoms and substituted with an electron-donating group; therein $Ar^5$ to $Ar^7$ and $R^{19}$ to $R^{36}$ may be each independently unsubstituted or substituted with an alkyl group having 1 to 10 carbon atoms, an alkoxy group having 1 to 10 carbon atoms, an aralkyl group having 6 to 20 carbon atoms, an arylalkyl group having 6 to 10 carbon atoms, or an amino group containing hydrocarbon groups having 1 to 20 carbon atoms. The substituents may be combined with each other to form a saturated or unsaturated five-membered or six-membered ring.

Preferable examples of the aryl group in the general formulae (IV) to (X) described above are phenyl group, biphenylyl group, naphthyl group, pyrenyl group, terphenylyl group, anthranyl group, tolyl group, xylyl group,: stilbenyl group, thienyl group, bithienyl group, thiophene group, bithiophene group, terthiophene group and the like Preferable examples of the arylene group are phenylene group, biphenylene group, naphthylene group, anthranylene group, terphenylene group, pyrenilene group, stilbenylene group, thienylene group, bithienylene group and the like.

Preferable examples of the trivalent aromatic ring are the following groups:

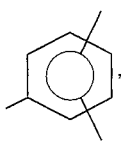

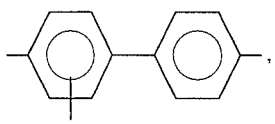

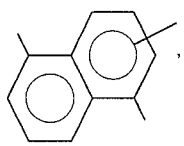

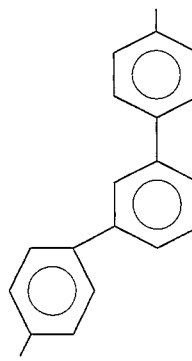

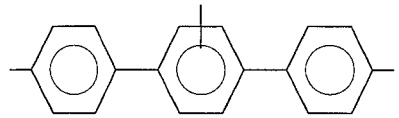

Examples of above-mentioned substituents are as following. Examples of the aryloxy group are phenyloxy group, biphenyloxy group, naphthyloxy group, anthranyloxy group, terphenyloxy group, pyrenyloxy group and the like. Examples of the alkyl group are methyl group, ethyl group, isopropyl group, tertiary butyl group, pentyl group, hexyl group and the like. Examples of the alkoxy group are methoxy group, ethoxy group, isopropoxy group, tertiary butoxy group, pentyloxy group and the like. Examples of the amino group containing hydrocarbon groups are dimethylamino group, diethylamino group, diphenylamino group, phenylethylamino group, phenylmethylamino group, ditolylamino group, ethylphenylamino group, phenylnaphthylamino group, phenylbiphenylamino group and the like.

$D^1$ to $D^{12}$ in the general formulae (IV) to (X) described above indicate each an aryl group having 1 to 20 carbon atoms and substituted with an electron-donating group or a condensed polycyclic group having 10 to 30 carbon atoms and substituted with an electron-donating group. The electron-donating group is preferably an alkoxy group having 1 to 10 carbon atoms, an aryloxy group having 6 to 20 carbon atoms, or an amino group containing hydrocarbon groups having 1 to 30 carbon atoms, and more preferably an amino group containing hydrocarbon groups having 1 to 30 carbon atoms. Examples of the amino group are groups represented by the following general formula (XII):

$$-N\begin{matrix}X^1\\X^2\end{matrix} \qquad (XII)$$

wherein $X^1$ and $X^2$ indicate each independently an aryl group having 6 to 20 carbon atoms, an alkyl group having 1 to 10 carbon atoms or an aralkyl group having 6 to 20 carbon atoms and may combine with each other to form a saturated or unsaturated ring structure. $X^1$ and $X^2$ may be substituted with an alkyl group having 1 to 10 carbon atoms, an aralkyl group having 7 to 10 carbon atoms, an aryloxy group having 6 to 10 carbon atoms or an alkoxy group having 6 to 10 carbon atoms. $X^1$ and $X^2$ which are aryl groups as substituents in the amino group represented by the general formula (XII) may combine with each other to form an aromatic ring containing nitrogen.

Examples of the electron-donating group described above are: aryloxy groups, such as phenyloxy group, biphenyloxy group, naphthyloxy group, anthranyloxy group, terphenylyloxy group and the like; alkoxy groups, such as methoxy group, ethoxy group, isopropoxy group, tertiary butoxy group, pentyloxy group and the like; and amino groups containing hydrocarbon groups, such as dimethylamino group, diethylamino group, diphenylamino group, phenylmethylamino group, phenylethylamino group, phenylmethylethylamino group, ditolylamino group, ethylphenylamino group, phenylnaphthylamino group, phenylbiphenylylamino group and the like.

Specific examples of $D^1$ to $D^{12}$ are the following groups:

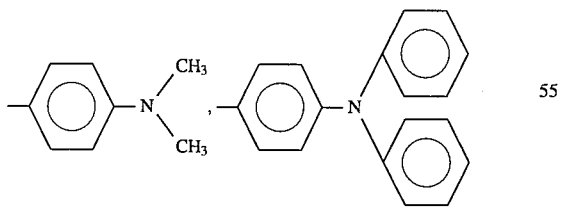

-continued

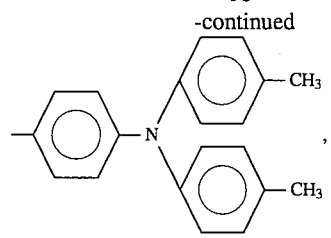

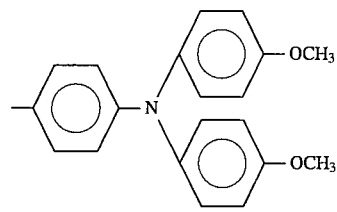

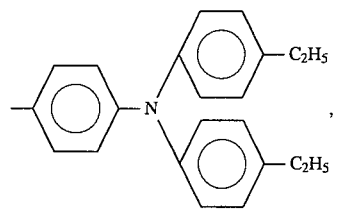

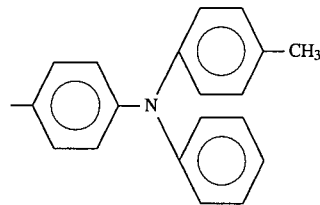

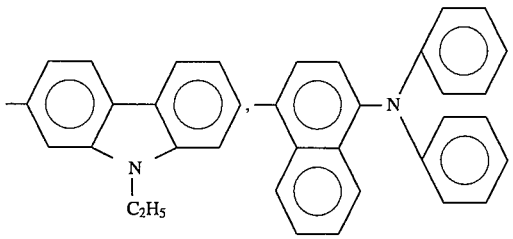

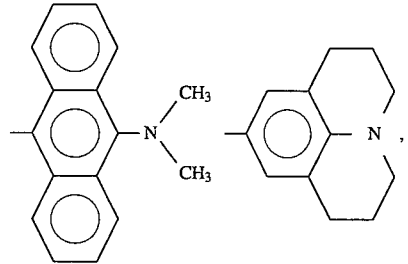

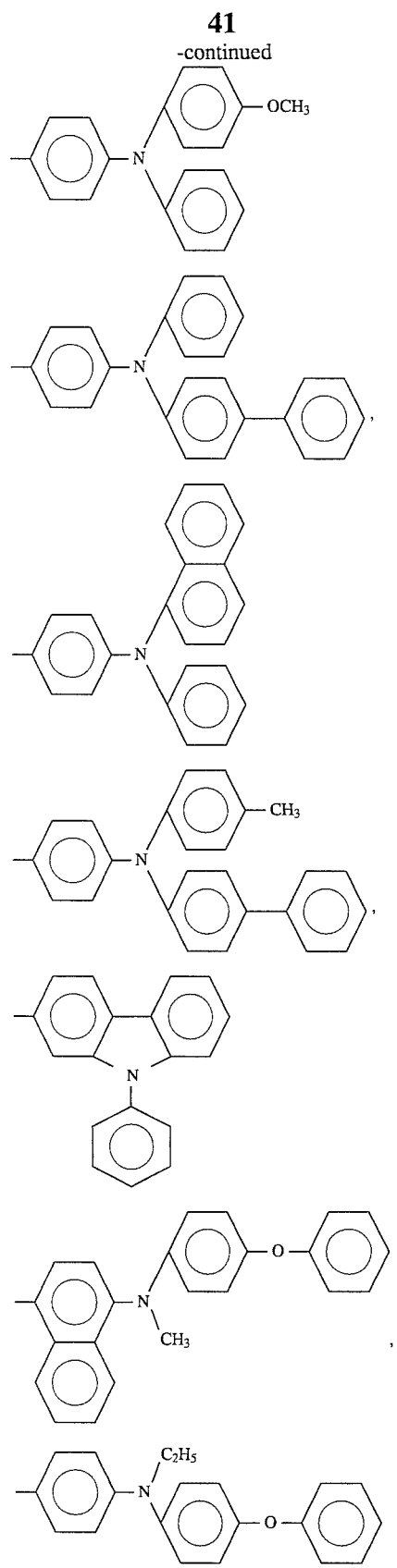
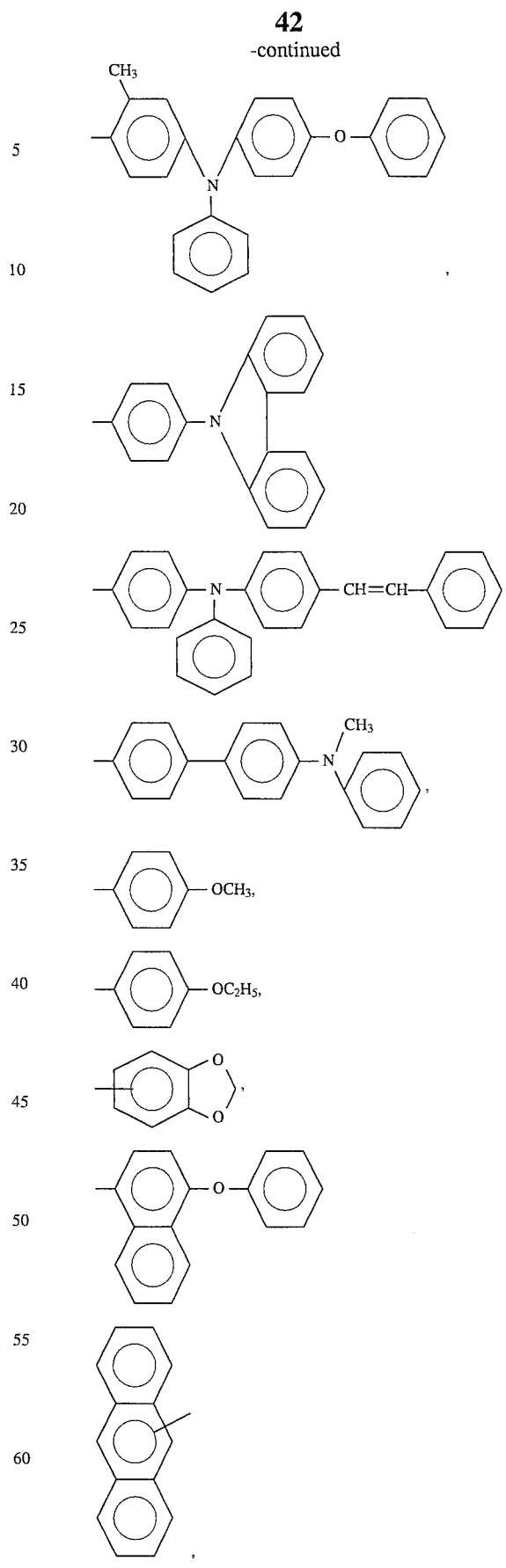

43
-continued
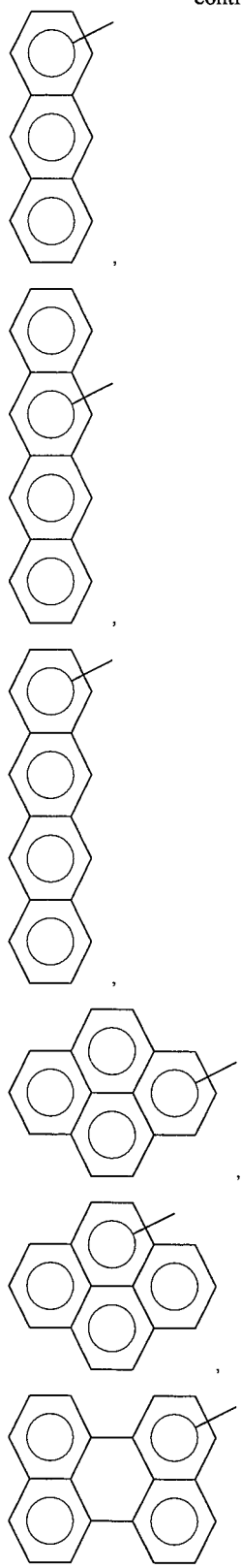
44
-continued
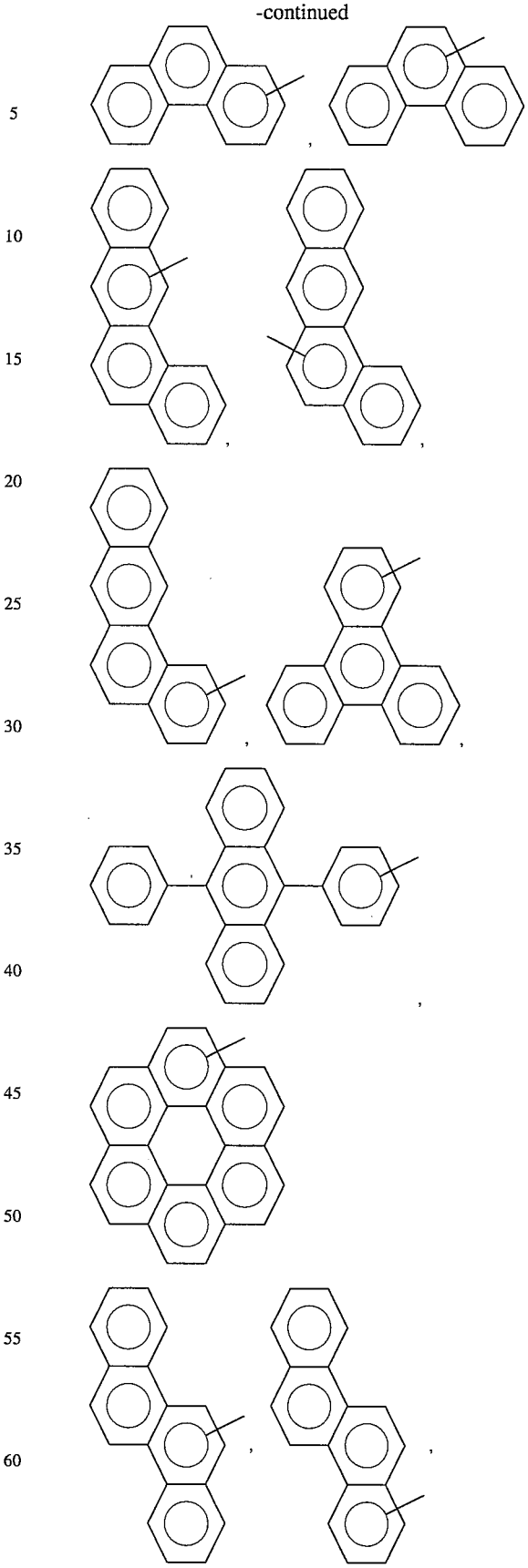

-continued
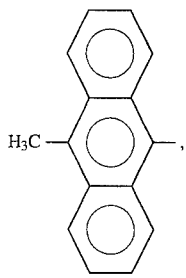
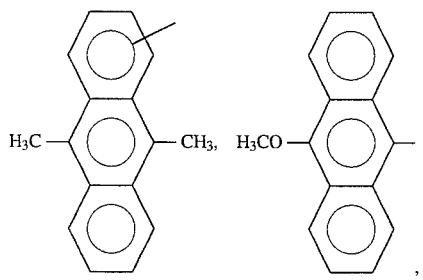
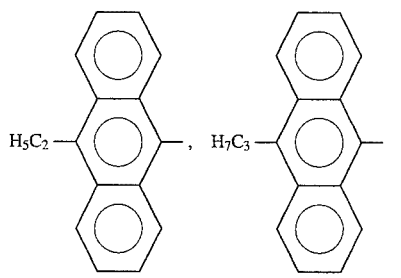
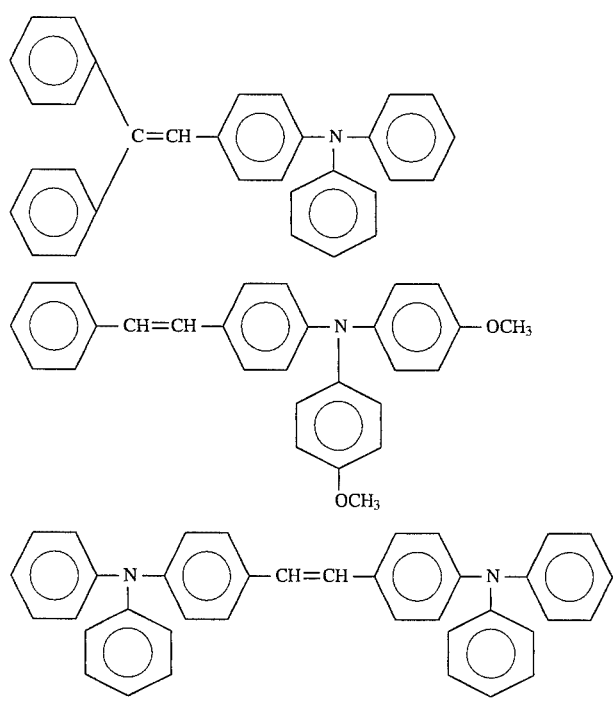
Specific examples of the compounds represented by the general formulae (IV) to (X) are the following compounds:

-continued
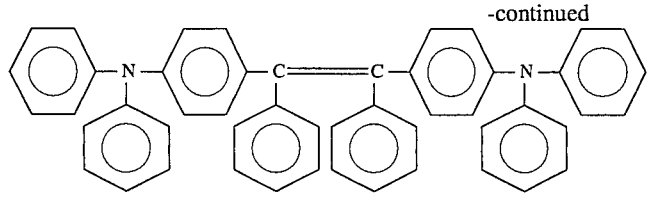
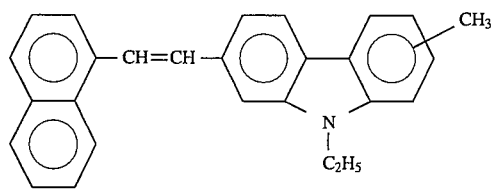
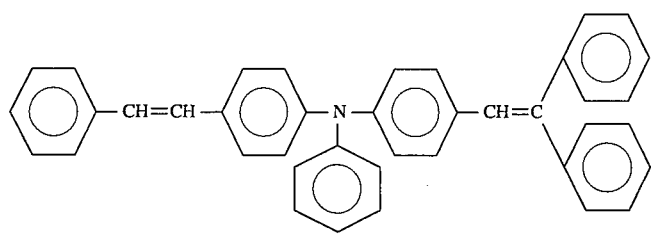
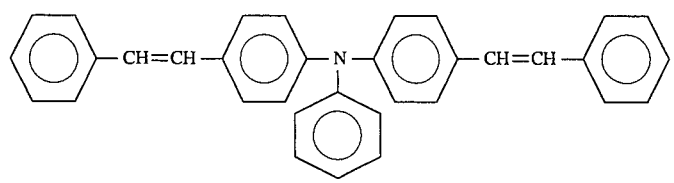
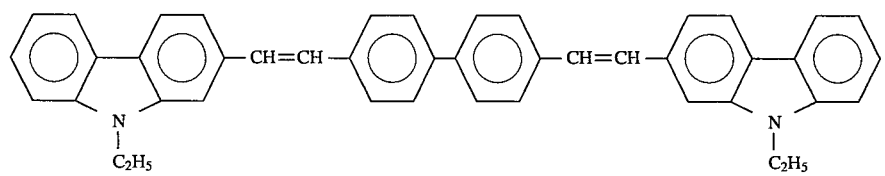
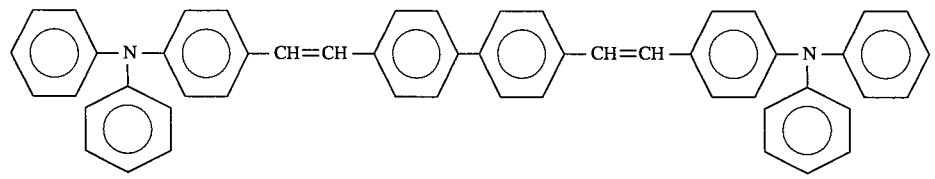
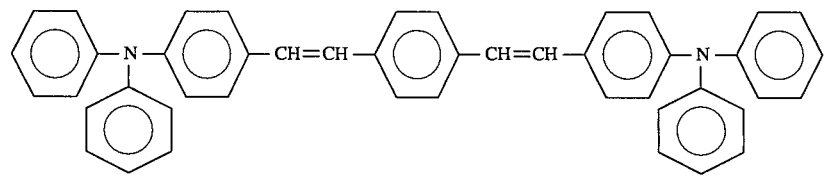
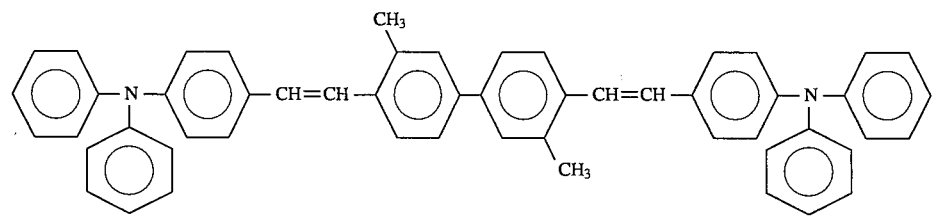

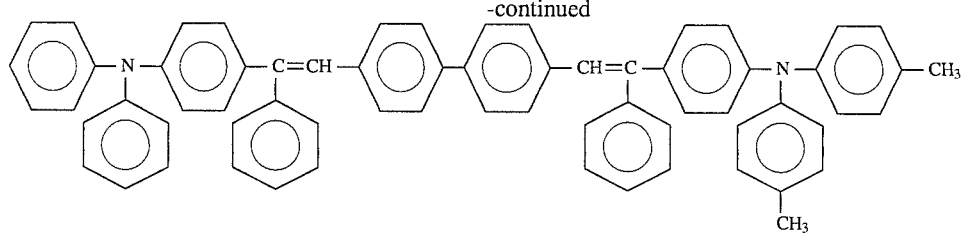
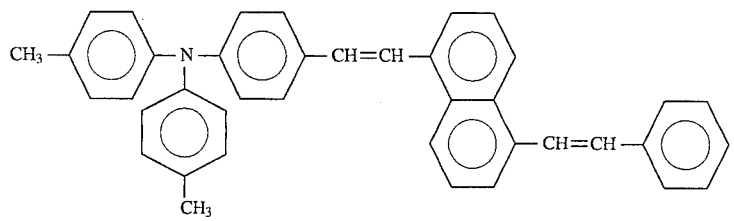
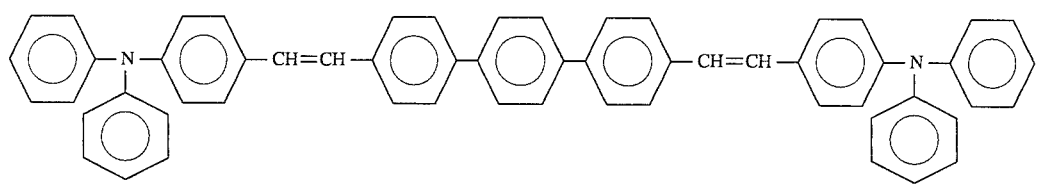
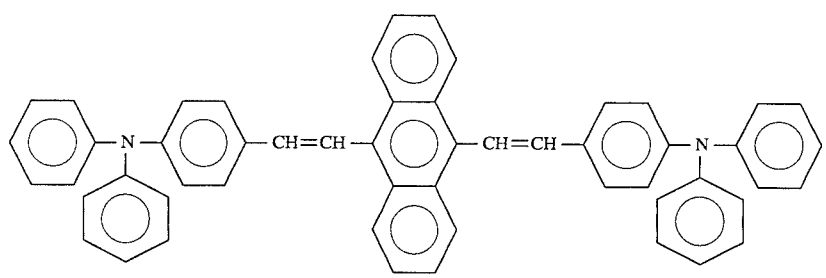
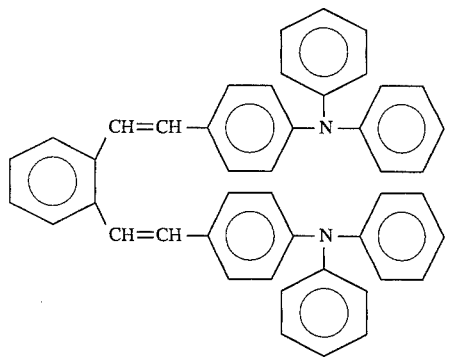
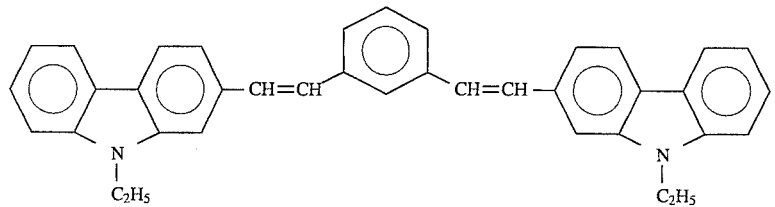
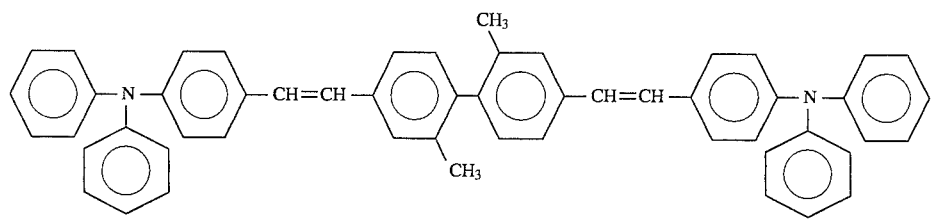

-continued
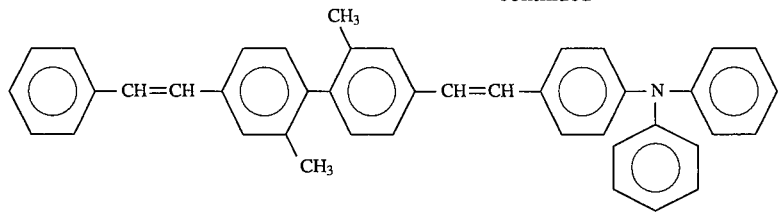
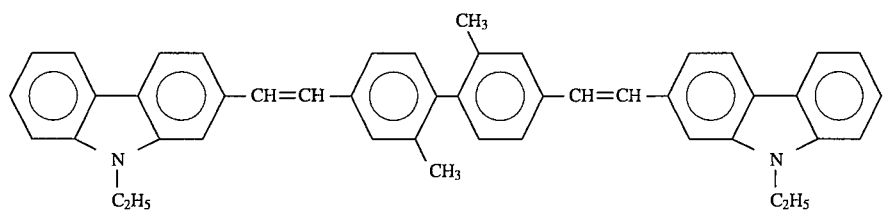
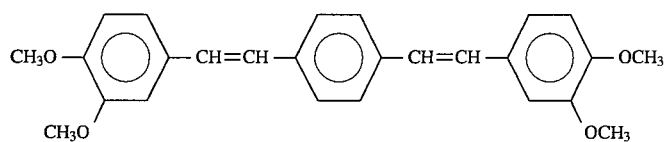
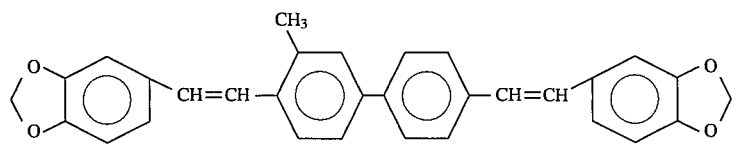
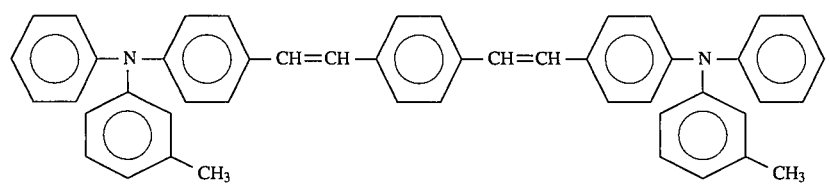
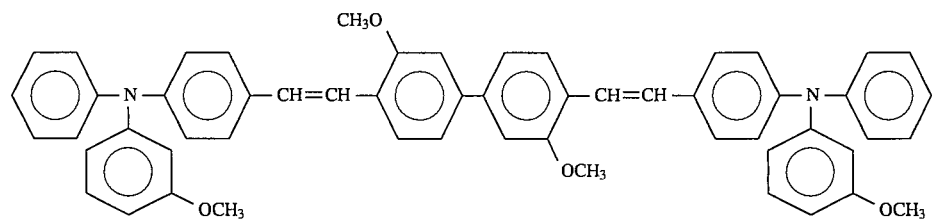
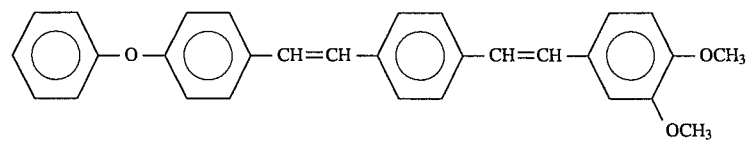
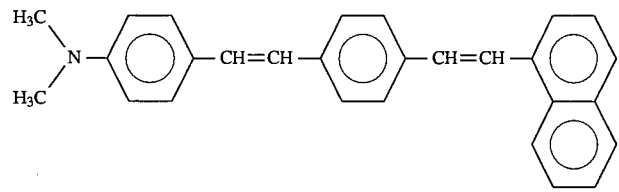
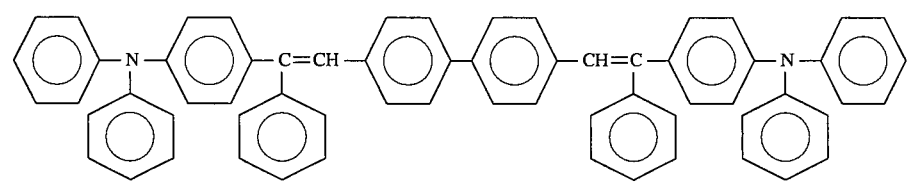

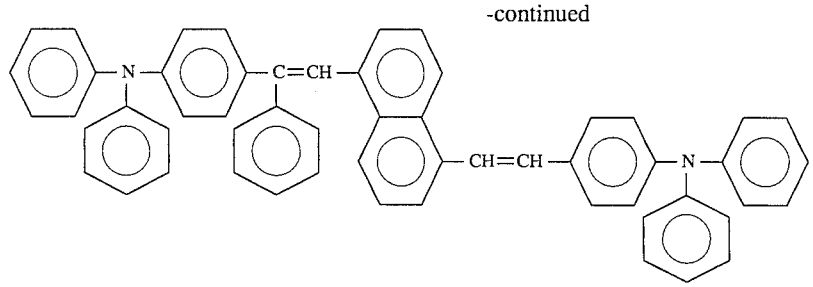
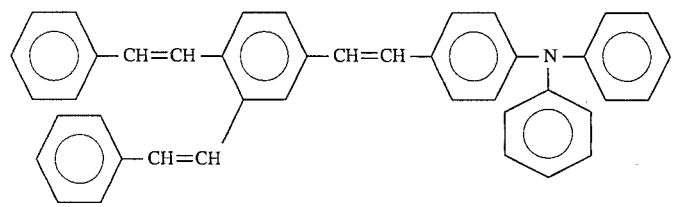
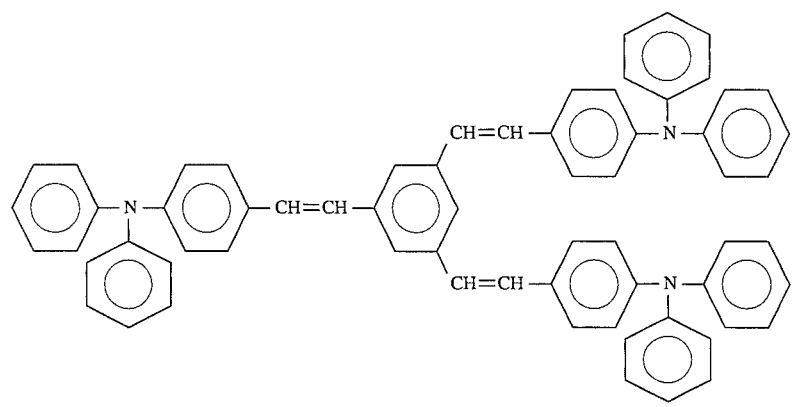
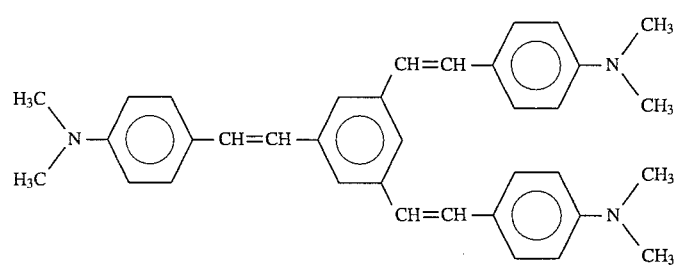
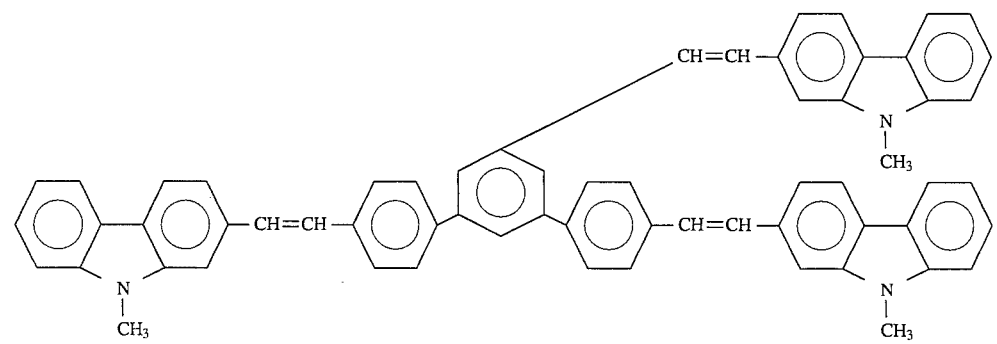
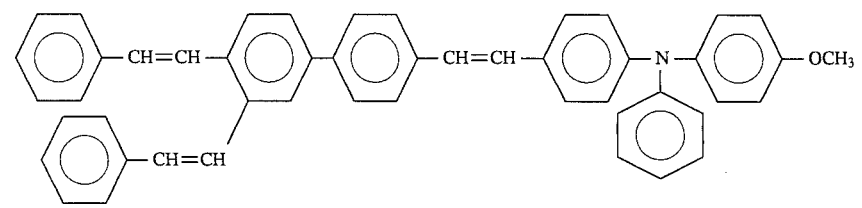

-continued
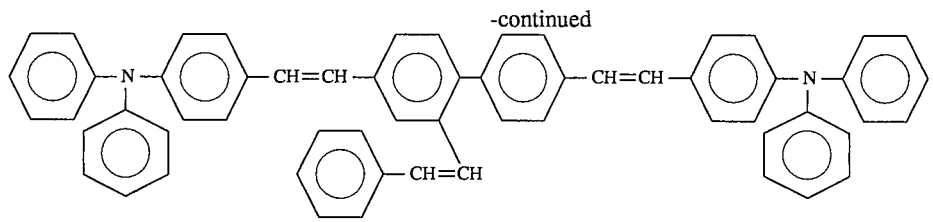
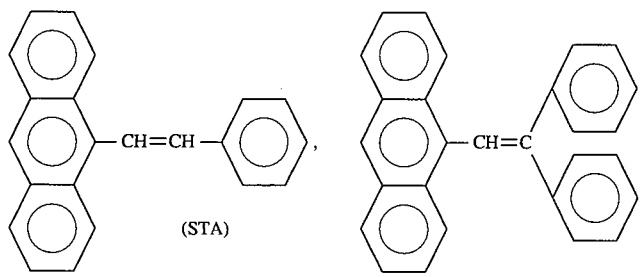
(STA)
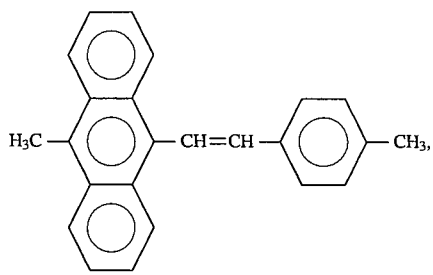
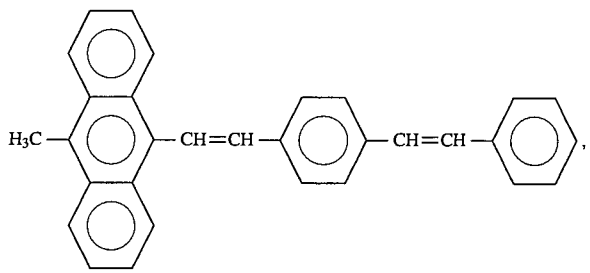
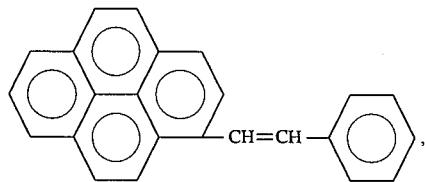
(STPy)
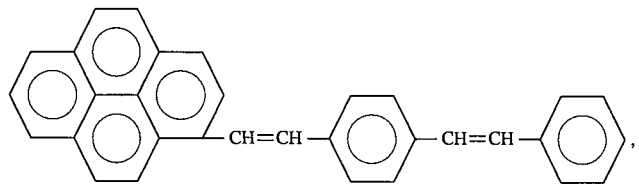
(STSTPy)

-continued
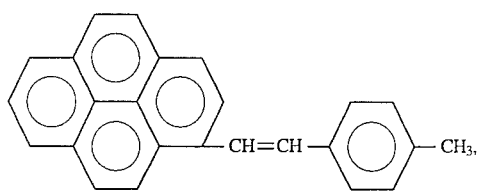
(MeSTPy)
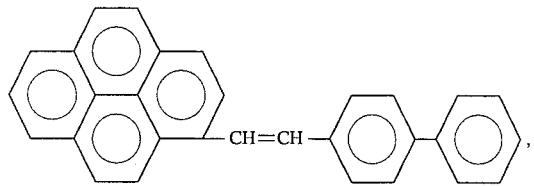
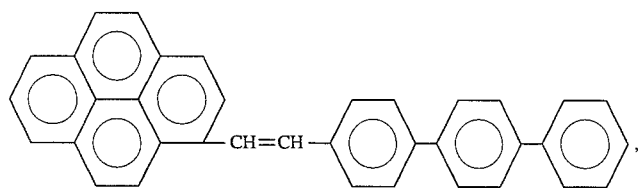
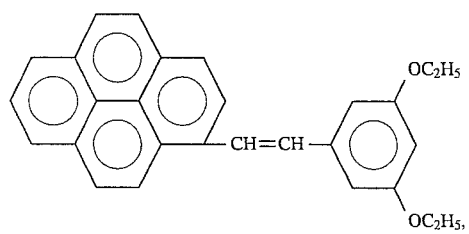
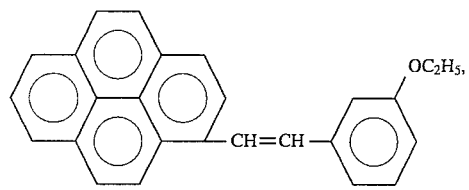
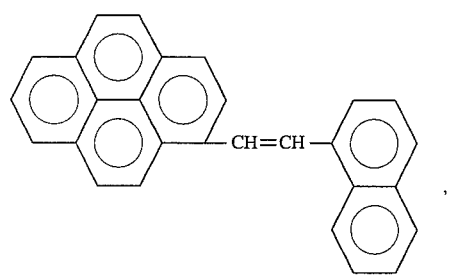
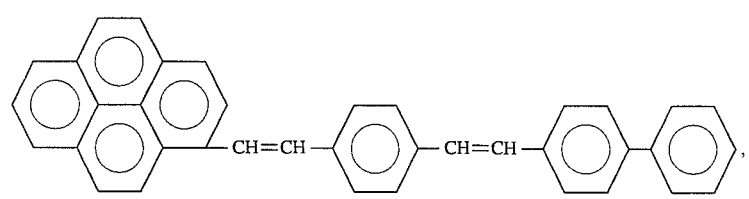
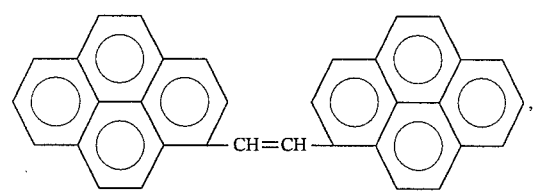

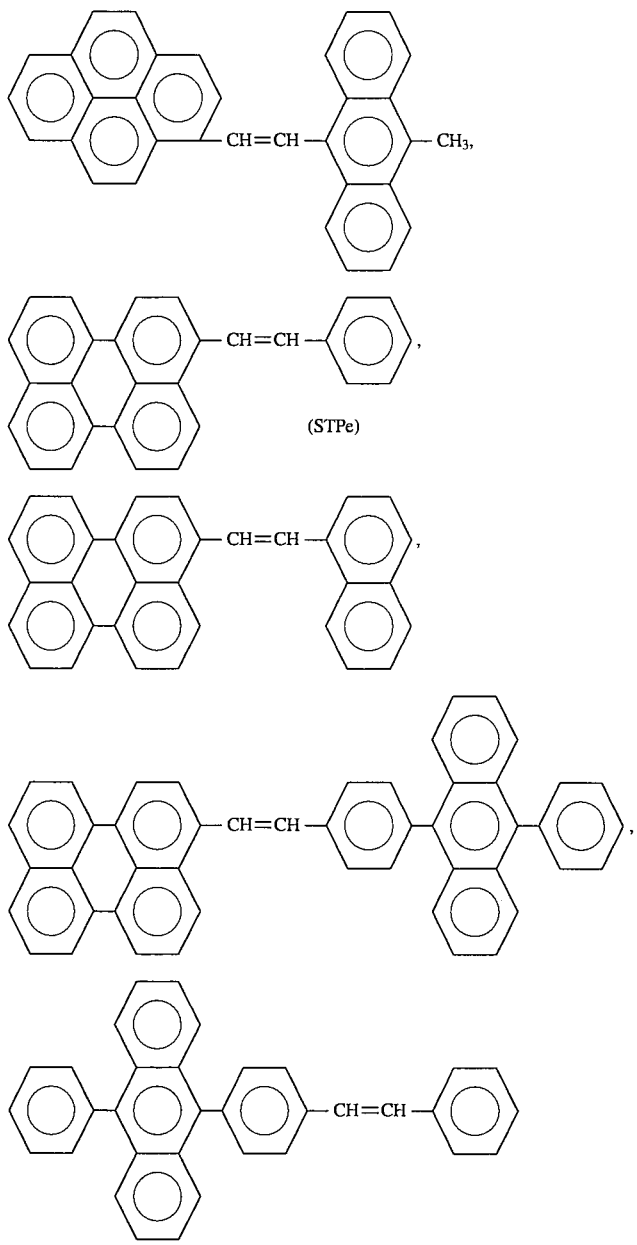

In the organic EL device of the present invention, it is necessary that an organic compound having a fluorescence peak wave length of 580 nm or longer to 650 nm or shorter in solution state is contained in at least one layer selected from said first light emitting layer, said second light emitting layer and other organic compound layers. The organic compound is not particularly limited so long as it has a fluorescence peak wave length of 580 nm or longer to 650 nm or shorter in solution state. Examples of the organic compound are dicyanomethylenepyran derivatives, dicyanomethylenethiopyran derivatives, fluorescein derivatives, perylene derivatives and the like used as red light emitting laser color elements which are described in European Patent Laid-Open No. 0281381. Specific examples thereof are the following compounds:

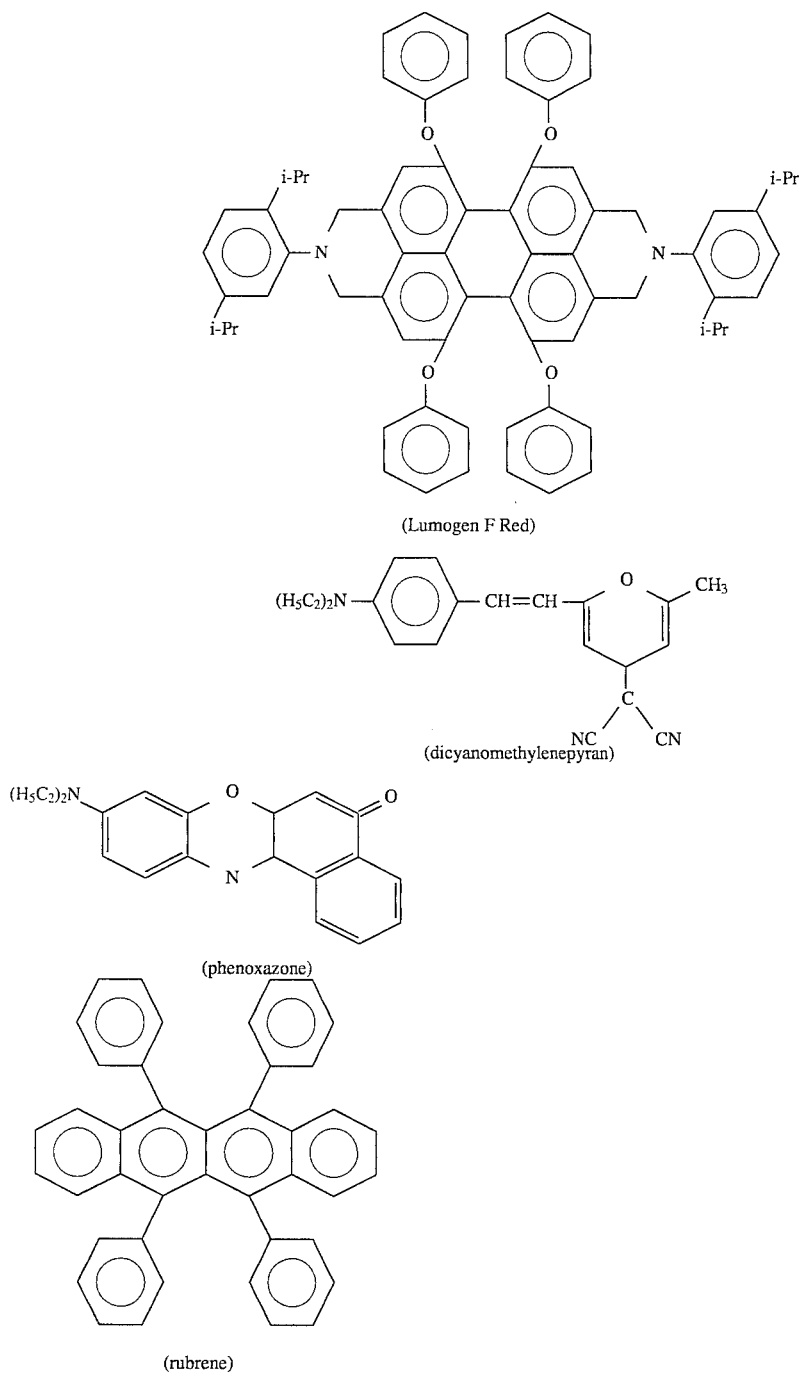

(Lumogen F Red)

(dicyanomethylenepyran)

(phenoxazone)

(rubrene)

It is necessary that the organic compound is contained in a concentration of 0.1 to 10 mol %, preferably 0.5 to 5 mol %, of the organic compounds forming the selected layer. The concentration range of 0.1 to 10 mol % is selected to avoid loss of light by the effect of concentration.

In the structure of the organic EL device of the present invention, structures other than those of the light emitting layers are not limited but any structure can be adopted according to desire. Components in an organic EL device having a structure of an anode/a hole injecting and transporting layer/light emitting layers/an electron injecting and transporting layer/a cathode are described specifically.

The organic EL device of the present invention is preferably formed on a supporting substrate.

The supporting substrate is preferably a plate having transparency, generally made of glass, transparent plastic, quartz or the like.

As to the anode in the organic EL device of the present invention, a metal, an alloy, an electric conductive compound or a mixture thereof, all having a large work function (4 eV or more), is preferably used as an electrode material. Specific examples of the electrode material are metals, such as Au, and transparent or translucent materials having dielectric property, such as CuI, ITO, $SnO_2$, ZnO and the like. The anode can be prepared by forming the electrode material into a thin film by vapor deposition or sputtering. To obtain light emission from the electrode, it is preferable that transmittance of the electrode is more than 10 % and resistance of the sheet as the electrode is preferably several hundred $\Omega/\square$ or less.

The film thickness of the anode is in the range of 10 nm to 1 μm, preferably in the range of 10 to 200 nm, depending upon the material.

On the other hand, as to the cathode, a metal, an alloy, a electric conductive compound or a mixture thereof, all having a small work function (4 eV or less), is preferably used as an electrode material. Specific exhmples of the electrode material are sodium, sodiumpotassium alloy, magnesium, lithium, magnesium/copper mixtures, $Al/Al_2O_3$, indium, rare earth metals and the like. The anode can be prepared by forming the electrode material into a thin film by vapor deposition or sputtering. Resistance of the sheet as the electrode is preferably several hundred $\Omega/\square$ or less. The film thickness is usually in the range of 10 nm to 1 μm, preferably in the range of 50 to 200 nm. In the EL device of the present invention, it is advantageous that either anode or cathode is transparent or translucent because light emission is transmitted and obtained with a high efficiency.

The light emitting layers in the present EL device comprise the first light emitting layer and the second light emitting layer described above and have a laminate structure in which the first light emitting layer and the second light emitting layer are laminated in this order on the transparent electrode or the anode. Particularly, it is preferred that the light emitting layer closer to the cathode has a higher electron transporting ability than that of the light emitting layer farther from the cathode. In the EL device, major light emission takes place in the two light emitting layers and, making use of light or energy of an excited state formed therein, light is emitted also from the organic compound having a fluorescence peak wave length of 580 nm or longer to 650 nm or shorter in solution state. The white light is then transmitted through the transparent electrode. When the order of lamination of the first light emitting layer and the second light emitting layer is reversed, the light emitted from the first light emitting layer is absorbed by the second light emitting latter and good white light is not obtained. The organic compound having a fluorescence peak wave length of 580 nm or longer to 650 nm or shorter in solution state emits light of longer wave lengths and the light emitted is not absorbed by other components. Therefore, this organic compound may be contained in any of the layers.

Thickness of the second light emitting layer is preferably identical to or larger than that of the first light emitting layer. Thickness of each light emitting layers can be suitably selected according to conditions within this range. The reason for this range is that the green component is required to have a relative luminance of light emission 5 to 15 times larger than that of the blue component for emission of the white light.

Method of forming the light emitting layers described above is not limited. They can be prepared by forming thin films by a known method, such as the vapor deposition method, the spin-coating method, the casting method, the LB method and the like, but particularly, a molecular accumulated film is preferable. A molecular accumulated film therein is a thin film formed by depositing said compound from gaseous state, or a thin film formed by solidification of said compound from a solution or a liquid state. Usually, said molecular accumulated film is distinguished from a thin film (a molecular built-up film) formed by the LB method, by the difference in aggregation structure or the higher-order structure, or the functional difference resulting therefrom.

As described above, the light emitting layers of the present invention has the injecting function by which, at application of electric field, holes can be injected from the anode or the hole injecting and transporting layer and electrons can be injected from the cathode or the electron injecting and transporting layer, the transporting function by which the injected charges (electrons and holes) can be moved by the force of the electric field and the light emitting function by which a place for recombination of electrons and holes is provided, permitting light emission. The light emitting layers of the present invention are layers from which visible light is emitted. Easiness of injection of holes may be different from that of electrons. The transporting function of holes expressed by mobility of holes may be different from that of electrons expressed by mobility of electrons. However, it is preferable that either of holes and electrons are moved. Particularly, it is preferable that the electron transporting function is larger than the hole transporting function in the second light emitting layer. Furthermore, in the light emitting materials of the present invention, light may be emitted with supply of excited state formed by recombined charges in another organic compound layer.

Next, the hole injecting and transporting layer in the EL device of the present invention is not necessary required for the present device, but preferably used for the purpose of improving the light emission ability. The preferable material of said hole injecting and transporting layer is one which transports holes to a light emitting layer at a lower electric field. Still more preferably, mobility of holes is at least $10^{-6}$ $cm^2$/volt.sec in an electric field of $10^4$ to $10^6$ volt/cm. For example, a material can be selected and used according to desire from conventional materials used as charge injecting and transporting materials of holes in photoconductive materials and generally known materials used as hole injecting and transporting layers in EL devices.

Examples of materials for the hole injecting and transporting layer are: triazole derivatives (described in the specification of U.S. Pat. No. 3,112,197, etc.); oxadiazole derivatives (described in the specification of U.S. Pat. No. 3,189,447, etc.); imidazole derivatives (described in Japanese Patent Publication No. 16096/1962, etc.); polyarylalkane derivatives (described in the specifications of U.S. Pat. Nos. 3,615,402, 3,820,989 and 3,542,544; in Japanese Patent Publication Nos. 555/1970 and 10983/1976, in Japanese Patent Application Laid-Open Nos. 93224/1976, 17105/1980, 4148/1981, 108667/1980, 156953/1980 and 36656/1981, etc.); pyrazoline derivatives and pyrazolone derivatives (described in the specifications of U.S. Pat. Nos. 3,180,729 and 4,278,746, in Japanese Patent Application Laid-Open Nos. 88064/1980, 88065/1980, 105537/1074, 51086/1980, 80051/1981, 88141/1981, 45545/1982, 112637/1979 and 74546/1970, etc.); phenylenediamine derivatives (described in the specification of U.S. Pat. No. 3,615,404, in Japanese Patent Publication Nos. 10105/1976, 3712/1971 and 25336/1972, in Japanese Patent Application Laid-Open Nos. 53435/1979, 110536/1979 and 119925/ 1979, etc.); arylamine derivatives (described in the specifications of U.S. Pat. Nos. 3,567,450, 3,180,703, 3,240,597, 3,658,520, 4,232,103, 4,175,961 and 4,012,376, in Japanese Patent Publication Nos. 35702/1974 and 27577/1964, in Japanese Patent Application Laid-Open Nos. 144250/1980, 119132/1981 and 22437/1981, in West German Patent No. 1,110,518, etc.); amino-substituted chalcone derivatives (described in the specification of U.S. Pat. No. 3,526,501, etc.); oxazole derivatives (described in the specification of U.S. Pat. No. 3,257,203, etc.); styrylanthracene derivatives (described in Japanese Patent Application Laid-Open No. 46234/1981); fiuorenone derivatives (described in Japanese Patent Application Laid-Open No. 110837/1979, etc.);

hydrazone derivatives (described in the specification of U.S. Pat. No. 3,717,462; in Japanese Patent Application Laid-Open Nos. 59143/1979, 52063/1980, 52064/1980, 46760/1980, 85495/1980, 11350/1982, and 148749/1982 and 311591/1990, etc.); and stilbene derivatives (described in Japanese Patent Application Laid-Open Nos. 210363/1986, 228451/1986, 14642/1986, 72255/1986, 47646/1987, 36674/1987, 10652/1987, 30255/1987, 93445/1985, 94462/1985, 174749/1985 and 175052/1985, etc.).

Other examples of the material for the hole injecting and transporting layer are: silazane derivatives (described in the specification of U.S. Pat. No. 4,950,950); polysilane based materials (described in Japanese Patent Application Laid-Open No. 204996/1990); aniline-based copolymers (described in Japanese Patent Application Laid-Open No. 282263/1990); electric conductive polymeric oligomers, particularly thiophene oligomers, disclosed in the specification of WO 91/03142; and the like.

In the present invention, the above compounds can be used as the material of the hole injecting and transporting layer, but it is preferred to use porphyrin compounds (described in Japanese Patent Application Laid-Open No. 295695/1988, etc.) and aromatic tertiary amine compounds and styrylamine compounds (described in the specification of U.S. Pat. No. 4,127,412; in Japanese Patent Application Laid-Open Nos. 27033/1978, 58445/1979, 149634/1979, 64299/1979, 79450/1980, 144250/1980, 119132/1981, 295558/1986, 98353/1986 and 295695/1988, etc.), and most preferably, said aromatic tertiary amine compounds are used.

Representative examples of said porphyrin compound are: porphin, 1,10,15,20-tetraphenyl-21H,23H-porphin copper (II), 1,10,15,20-tetraphenyl-21H,23H-porphin zinc (II), 5,10,15,20-tetrakis(pentafluorophenyl)-21H,23H-porphin, silicon phthalocyanine oxide, aluminum phthalocyanine chloride, phthalocyanine (no metal), dilithium phthalocyanine, copper tetramethylphthalocyanine, copper phthalocyanine, chromium phthalocyanine, zinc phthalocyanine, lead phthalocyanine, titanium phthalocyanine oxide, magnesium phthalocyanine, copper octamethylphthalocyanine and the like.

Representative examples of said aromatic tertiary amine compound and said styrylamine compound are: N,N,N',N'-tetraphenyl-4,4'-diaminophenyl, N,N'-diphenyl-N,N'-di(3-methylphenyl)-4,4'-diaminobiphenyl (TPDA), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4(di-p-tolylamino)styryl]stilbene, 4-N,N-diphenylamino-(2-diphenylvinyl)benzene, 3-methoxy-4'-N,N-diphenylaminostilbene, N-phenylcarbazole, aromatic dimethylidine compounds and the like.

The aromatic methylidine compounds described as examples of the material of the light emitting layers (refer to WO 92/05131 and Japanese Patent Application Laid-Open No. 231970/1991) can be used also as the material of the hole injecting and transporting layer. Inorganic compounds, such as p-type Si, p-type SiC and the like, (refer to WO 90/05998) can also be used as the material of the hole injecting and transporting layer.

The hole injecting and transporting layer in the EL device of the present invention can be obtained by forming the above compound into a film by a known method of film forming, such as the vacuum vapor deposition method, the spin-coating method, the casting method and the LB method. Film thickness of the hole injecting and transporting layer is not particularly limited, but generally 1 nm to 10 μm, preferably 5 nm to 5 μm.

The hole injecting and transporting layer may consist of one layer comprising one or two or more of these hole injecting and transporting materials, or may be a laminate of hole injecting and transporting layers comprising other compounds than the before-mentioned materials for the hole injecting and transporting layer.

In the organic EL device of the present invention, it is preferable that said electron injecting and transporting layer contain a material showing high adhesion to the light emitting layers and the cathode to enhance adhesion between the light emitting layer and the cathode. Examples of the material showing high adhesion are nitro-substituted fluorenone derivatives, anthraquinodimethane derivatives, diphenylquinone derivatives, thiopyran dioxide derivatives, heterocyclic tetracarboxylic acid anhydrides, such as naphthalene perylene derivatives and the like, carbodiimides, fluorenylidenemethane derivatives, anthraquinodimethane derivatives, anthrone derivatives, oxadiazol derivatives and other specific electron conductive compounds.

Other examples are metal complexes (Al, Zn, Li, Ga, Be, In, Mg, Cu, Ca, Sn or Pb) of 8-hydroxyquinoline or derivatives thereof. Specific examples are metal chelated oxinoid compounds containing chelates of oxine (generally, 8-quinolinol or 8-hydroxyquinoline). These compounds exhibit high level properties, and are easy to be formed into a thin film.

Further, specific examples of the chelated oxinoid compound are: tris(8-quinolinol) aluminum, bis(8-quinolinol) magnesium, bis(benzo-8-quinolinol) zinc, bis(2-methyl-8-quinolilato) aluminum oxide, tris(8-quinolinol) indium, tris(5-methyl-8-quinolinol) aluminum, 8-quinolinol lithium, tris(5-chloro-8-quinolinol) gallium, bis(5-chloro-8-quinolinol) calcium, 5,7-dichloro-8-quinolinol aluminum, tris(5,7-dibromo-8-hydroxyquinolinol) aluminum and the like.

Other preferable examples are metal-free or metal phthalocyanines and these compounds having an alkyl group or a sulfonic group substituted at the end. The distyrylpyrazine derivatives described above as the material of the light emitting layers can be used also as the material of the electron injecting and transporting layer. Further, inorganic compounds, such as p-type Si, p-type SiC and the like, (refer to International Patent Application Laid-Open No. WO 90/05998) can also be used as the material of the electron injecting and transporting layer.

The electron injecting and transporting layer in the EL device of the present invention can be obtained by forming the above compound into a film by a known method of film forming, such as the vacuum vapor deposition method, the spin-coating method, the casting method and the LB method. Film thickness of the electron injecting and transporting layer is not particularly limited, but generally 1 nm to 10 μm, preferably 5 nm to 5 μm.

The electron injecting and transporting layer may consist of one layer comprising one or two or more of these electron injecting and transporting materials, or may be a laminate of electron injecting and transporting layers comprising other compounds than the beforementioned materials for the electron injecting and transporting layer.

The organic EL device of the present invention shows light emission, particularly the white light emission, with high efficiency and excellent stability and favorably used as a light emission device in various kinds of displaying apparatus.

The present invention is described in more detail with reference to examples in the following; however, these examples are intended to illustrate the invention and are not to be construed to limit the scope of the invention.

EXAMPLES 1 to 3

A layer of ITO having a thickness of 100 nm was prepared on a glass substrate of 25 mm×75×1.1 mm by the vapor deposition method and the product was used for a transparent electrode substrate. This substrate was washed in isopropyl alcohol for 10 minutes with ultrasonic wave and dipped in isopropyl alcohol. The washed substrate was dried in dry nitrogen and then treated with UV ozone washing by using an apparatus manufactured by Samco International Institute, Inc. (UV-300) to obtain a transparent electrode substrate. This transparent electrode substrate was attached to a substrate holder of a commercial vapor deposition system (a product of Nippon Shinkuu Gijutu Co., Ltd.). In an electrically heated boat made of molybdenum, 200 mg of N,N'-diphenyl-N,N'-bis(3-methylphenyl)-[1,1-biphenyl]-4,4'-diamine (TPD) was placed. In another electrically heated boat made of molybdenum, 200 mg of 4,4'-bis(2,2'-diphenylvinyl)biphenyl (DPVBi) was placed. In still another electrically heated boat made of molybdenum, a compound (A) shown in Table 1 was placed. The vacuum chamber was evacuated to $1\times10^{-4}$ Pa. Then, the boat containing TPD was heated to 215° to 220° C. and TPD was laminated by vapor deposition on the transparent supporting substrate at a deposition rate of 0.1 to 0.3 nm/sec to form a hole injecting and transporting layer of 60 nm thickness. Temperature of the substrate in this deposition process was room temperature.

Without taking the substrate out of the vacuum chamber, the first light emitting layer was laminated by vapor deposition on the hole injecting and transporting layer to a thickness of 40 nm by heating the boat containing DPVBi. The boat containing the compound (A) was heat at the same time to have the first light emitting layer containing the compound (A) in a content (mol %) shown in the column (b) in Table 1.

Subsequently, the pressure in the vacuum chamber was raised to atmospheric pressure. In an electrically heated boat made of molybdenum, 200 mg of aluminum complex of 8-hydroxyquinoline (Alq) was placed and a compound (C) shown in Table 1 was placed in another electrically heated boat made of molybdenum. The vacuum chamber was evacuated again to $1\times10^{-4}$ Pa. Then, the boat containing Alq was heated to form a layer of 20 nm thickness as the second light emitting layer. The boat containing the compound (C) was heated at the same time to have the second light emitting layer containing the compound (C) in a content (mol %) shown in the column (d) in Table 1.

Pressure of the vacuum chamber was then raised to atmospheric pressure again. In an electrically heated boat made of molybdenum, 1 g of magnesium ribbon was placed and 500 mg of silver wire was placed in a tungsten basket. The vacuum chamber was evacuated to $1\times10^{-4}$ Pa. Then, magnesium and silver were laminated by vapor deposition simultaneously at a rate of 1.4 nm/sec for magnesium and at a rate of 0.1 nm/sec for silver to form a layer of a mixed metal of 150 nm thickness as the cathode.

TABLE 1

|  | (A) compound | (b) content of (A) (mol %) | (C) compound | (d) content of (C) (mol %) |
| --- | --- | --- | --- | --- |
| Example 1 | PAVBi | 3.0 | rubrene* | 0.5 |
| Example 2 | PAVTP | 3.0 | rubrene | 0.5 |
| Example 3 | PAVBi | 3.0 | Lumogen F | 3.0 |

*: a product of Aldrich Chemical Company, Inc.

Fluorescence peak wave lengths of each organic compound were as following: DPVBi (solid), 465 nm; PAVBi (solid), 463 nm; PAVTP (solid), 454 nm; Alq (solid), 500 nm; rubrene (a 0.1 weight % solution in dimethylformamide), 585 nm; and Lumogen F (a 0.1 weight % solution in dimethylformamide), 595 nm. The first light emitting layer and the second light emitting layer in Examples 1 to 3 had each color of emitted light shown below. The color of emitted light was determined by the following method: the first light emitting layer alone was formed separately on a glass substrate having no fluorescence at the times of preparation of the first light emitting layer in the process of preparation of the device; the second light emitting layer alone was formed separately in the same manner; the formed layers were taken out of the vacuum chamber; and color of light emitted from a light emitting layer was determined from fluorescence spectrum according to Japanese Industrial Standard Z8724. Color of light emitted from a light emitting layer in Examples 6 to 8 described below was determined by the same method.

| | |
| --- | --- |
| Color emitted from the first light emitting layer in Example 1: | blue |
| Color emitted from the second light emitting layer in Example 1: | orange |
| Color emitted from the first light emitting layer in Example 2: | greenish blue |
| Color emitted from the second light emitting layer in Example 2: | orange |
| Color emitted from the first light emitting layer in Example 3: | blue |
| Color emitted from the second light emitting layer in Example 3: | reddish orange |

Structural formulae of PAVBi and PAVTP are shown in the following:

PAVBi

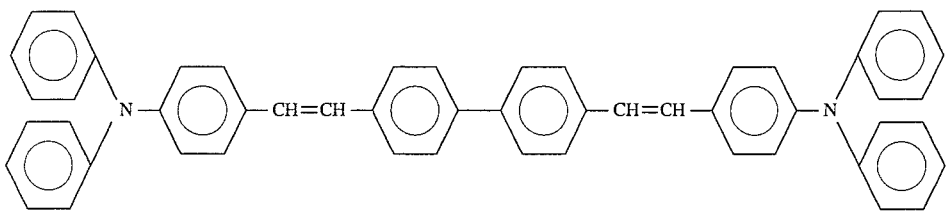

PAVTP

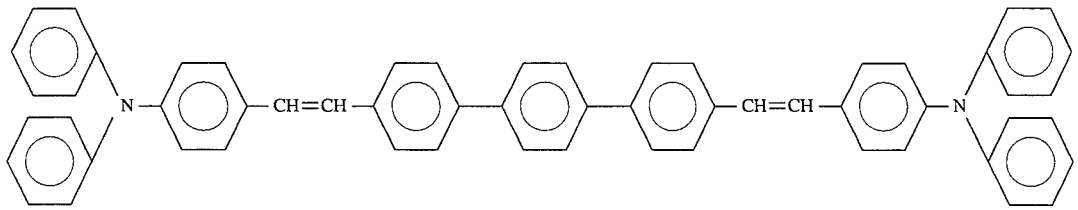

Representative values of the initial properties and half lives of these devices were obtained. Results are shown in Table 2. The half life was measured in the condition of: initial luminance, 100 cd/m$^2$; direct constant current driving; and driving environment, dry nitrogen atmosphere; and expressed by the time when the luminance reached a half of the initial value.

EXAMPLE 4

A glass substrate coated with ITO and having the same shape as that in Examples 1 to 3 was treated with the same washing process as that in Examples 1 to 3 to prepare a transparent electrode substrate. The substrate thus prepared was attached to a substrate holder in a vacuum chamber. In an electrically heated boat made of molybdenum, 200 mg of TPD was placed and rubrene was placed in another electrically heated boat made of molybdenum. The vacuum chamber was evacuated to $1\times10^{-4}$ Pa. Then, the boat containing TPD was heated and TPD was laminated by vapor deposition on the transparent supporting substrate at a deposition rate of 29 to 30 nm/sec to form a hole injecting and transporting layer of 60 nm thickness. The boat containing rubrene was heat at the same time to have the hole injecting and transporting layer containing 5 mol % of rubrene. Temperature of the substrate in this deposition process was room temperature. Then, pressure of the vacuum chamber was raised to atmospheric pressure. In another electrically heated boat made of molybdenum, 200 mg of PDVBi was placed and PAVBi was placed in still another boat made of molybdenum. The vacuum chamber was evacuated to $1\times10^{-4}$ Pa and DPVBi was laminated by vapor deposition on the hole injecting and transporting layer to form the first light emitting layer of 40 nm thickness. The boat containing PAVBi was heated at the same time to have the first light emitting layer containing 3 mol % of PAVBi. Pressure of the vacuum chamber was raised to atmospheric pressure. In another electrically heated boat made of molybdenum, 200 mg of Alq was newly placed. In still another electrically heated boat made of molybdenum, 1 g of magnesium ribbon was placed and 500 mg of silver wire was placed in a tungsten basket. The vacuum chamber was evacuated to $1\times10^{-4}$ Pa and the second light emitting layer of Alq was formed to 40 nm thickness. Then, magnesium and silver were laminated by vapor deposition simultaneously at a rate of 1.4 nm/sec for magnesium and at a rate of 0.1 nm/sec for silver to form a layer of a mixed metal of 150 nm thickness as the cathode.

Representative values of the initial properties and half life of this device were obtained by the same method as that in Examples 1 to 3. Results are shown in Table 2.

EXAMPLE 5

A glass substrate coated with ITO and having the same shape as that in Examples 1 to 3 was treated with the same washing process as that in Examples 1 to 3 to prepare a transparent electrode substrate and the substrate thus prepared was attached to a substrate holder in a vacuum chamber. In an electrically heated boat made of molybdenum, 200 mg of TPD was placed and 200 mg of DPVBi was placed in another electrically heated boat made of molybdenum. The vacuum chamber was evacuated to $1\times10^{-4}$ Pa. Then, the boat containing TPD was heated to 215° to 220° C. and TPD was laminated by vapor deposition on the transparent supporting substrate at a deposition rate of 0.1 to 0.3 nm/sec to form a hole injecting and transporting layer of 60 nm thickness. Temperature of the substrate in this deposition process was room temperature. Without taking the substrate out of the vacuum chamber, the first light emitting layer was laminated by vapor deposition on the hole injecting and transporting layer to 40 nm thickness by heating the boat containing PDVBi to 245° C.

Then, pressure of the vacuum chamber was raised to atmospheric pressure. In another electrically heated boat made of molybdenum, 200 mg of Alq was newly placed and Lumogen F red (a product of BASF Co.) was placed in still another boat made of molybdenum. The vacuum chamber was evacuated to $1\times10^{-4}$ Pa.

Subsequently, the second light emitting layer was formed to a thickness of 40 nm by heating the electrically heated boat made of molybdenum containing Lumogen F red to 330° C. and the electrically heated boat made of molybdenum containing Alq to 250° C. Therein, content of Lumogen F red in the second light emitting layer was adjusted to 3 mol % of Alq. Pressure of the vacuum chamber was raised to atmosperic pressure. Then, 1 g of magnesium ribbon was placed in a electrically heated boat made of molybdenum and 500 mg of silver wire was placed in a tungsten basket. The vacuum chamber was evacuated to $1\times10^{-4}$ Pa. Magnesium and silver were laminated by vapor deposition simultaneously at a rate of 1.4 nm/sec for magnesium and at a rate of 0.1 nm/sec for silver to form a layer of a mixed metal of 150 nm thickness as the cathode.:

Representative values of the initial properties and half life of this device were obtained by the same method as that in Examples 1 to 3. Results are shown in Table 2.

TABLE 2

| | initial properties | | | | | |
| --- | --- | --- | --- | --- | --- | --- |
| | voltage (V) | current density (mA/cm$^2$) | luminance of light (cd/m$^2$) | efficiency of light emission (lumen/w) | CIE chromaticity coordinates (x, y) | half life (hour) |
| Example 1 | 9.5 | 4.5 | 100 | 0.7 | (0.245, 0.278) | 1,000 |
| Example 2 | 9.5 | 5.0 | 100 | 0.7 | (0.245, 0.267) | 800 |
| Example 3 | 10.0 | 7.0 | 100 | 0.4 | (0.300, 0.320) | 600 |
| Example 4 | 11.0 | 6.5 | 100 | 0.4 | (0.265, 0.278) | 300 |
| Example 5 | 9.8 | 7.5 | 100 | 0.4 | (0.220, 0.240) | 200 |

As shown in Table 2, the results in Examples 1 to 4 show improved whiteness of the emitted light and quantum yield (correspondig to luminance/current density) as well as improved stability of light emission in comparison with those of Example 5.

EXAMPLES 6 to 8

A layer of ITO having a thickness of 100 nm was prepared on a glass substrate of 25 mm×75×1.1 mm by the vapor deposition method and the product was used for a transparent electrode substrate. This substrate was washed in isopropyl alcohol for 10 minutes with ultrasonic wave and dipped in isopropyl alcohol. The washed substrate was dried in dry nitrogen and then treatd with UV ozone washing by using an apparatus manufactured by Samco International Institute, Inc. (UV-300) to obtain a tranparent electrode substrate. This transparent electrode substrate was attached to a substrate holder of a commercial vapor deposition system (a product of Nippon Shinkuu Gijutu Co., Ltd.). In an electrically heated boat made of molybdenum, 200 mg of N,N'-diphenyl-N,N'-bis(3-methylphenyl)-[1,1-biphenyl]-4, 4'-diamine (TPD) was placed. In another electrically heated boat made of molybdenum, 200 mg of 4,4'-bis(2,2'-diphenylvinyl)biphneyl (DPVBi) was placed. In still another electrically heated boat made of molybdenum, a compound (A) shown in Table 3 was placed. The vacuum chamber was evacuated to $1\times10^{-4}$ Pa. Then, the boat containing TPD was heated to 215° to 220° C. and TPD was laminated by vapor deposition on the transparent supporting substrate at a deposition rate of 0.1 to 0.3 nm/sec to form a hole injecting and transporting layer of 60 nm thickness. Temperature of the substrate in this deposition process was room temperature.

Without taking the substrate out of the vacuum chamber, the first light emitting layer was laminated by vapor deposition on the hole injecting and transporting layer to a thickness of 40 nm by heating the boat containing DPVBi. The boat containing the compound (A) was heat at the same time to have the first light emitting layer containing the compound (A) in a content (mol %) shown in the column (b) in Table 3.

Subsequently, the pressure in the vacuum chamber was raised to atmospheric pressure. In an electrically heated boat made of molybdenum, 200 mg of aluminum complex of 8-hydroxyquinoline (Alq) was placed and a compound (C) shown in Table 3 was placed in another electrically heated boat made of molybdenum. The vacuum chamber was evacuated again to $1\times10^{-4}$ Pa. Then, the boat containing Alq was heated to form a layer of 20 nm thickness as the second light emitting layer. The boat containing the compound (C) was heated at the same time to have the second light emitting layer containing the compound (C) in a content (mol %) shown in the column (d) in Table 3.

Pressure of the vacuum chamber was then raised to atmospheric pressure again. In an electrically heated boat made of molybdenum, 1 g of magnesium ribbon was placed and 500 mg of silver wire was placed in a tungsten basket. The vacuum chamber was evacuated to $1\times10^{-4}$ Pa. Then, magnesium and silver were vapor deposited simultaneously at a rate of 1.4 nm/sec for magnesium and at a rate of 0.1 nm/sec for silver to form a layer of a mixed metal of 150 nm thickness as the cathode.

TABLE 3

| | (A) compound | (b) content of (A) (mol %) | (C) compound | (d) content of (C) (mol %) |
| --- | --- | --- | --- | --- |
| Example 6 | PAVBi | 3.0 | rubrene* | 0.3 |
| Example 7 | PAVTP | 3.0 | rubrene | 0.3 |
| Example 8 | PAVBi | 3.0 | Lumogen F | 2.0 |

*: a product of Aldrich Chemical Company, Inc.

Fluorescence peak wave lengths of each organic compound were as following: DPVBi (solid), 465 nm; PAVBi (solid), 463 nm; PAVTP (solid), 454 nm; Alq (solid), 500 nm; rubrene (a 0.1 weight % solution in dimethylformamide), 585 nm; and Lumogen F (a 0.1 weight % solution in dimethylformamide), 595 nm.

The first light emitting layer and the second light emitting layer in Examples 6 to 8 had each color of emitted light shown in the following:

| | |
| --- | --- |
| Color emitted from the first light emitting layer in Example 6: | blue |
| Color emitted from the second light emitting layer in Example 6: | orange |
| Color emitted from the first light emitting layer in Example 7: | greenish blue |
| Color emitted from the second light emitting layer in Example 7: | orange |
| Color emitted from the first light emitting layer in Example 8: | blue |
| Color emitted from the second light emitting layer in Example 8: | reddish orange |

Representative values of the initial properties and half lives of these devices were obtained. Results are shown in Table 4. The half life was measured in the condition of:

initial luminance, 100 cd/m²; direct constant current driving; and driving environment, dry nitrogen atmosphere; and expressed by the time when the luminance reached a half of the initial value.

As shown in Table 4, whiteness of light was further improved by increase in thickness of the second light emitting layer.

TABLE 4

| | initial properties | | | | |
|---|---|---|---|---|---|
| | voltage (V) | current density (mA/cm²) | luminance of light (cd/m²) | efficiency of light emission (lumen/w) | CIE chromaticity coordinates (x, y) | half life (hour) |
| Example 6 | 9.8 | 4.7 | 100 | 0.68 | (0.286, 0.296) | 1,000 |
| Example 7 | 9.8 | 5.0 | 100 | 0.68 | (0.286, 0.289) | 800 |
| Example 8 | 10.5 | 7.2 | 100 | 0.37 | (0.302, 0.325) | 600 |

What is claimed is:

1. An organic electroluminescence device which comprises light emitting layers placed between a pair of electrodes at least one of which electrodes is transparent or translucent, said light emitting layers comprising a first light emitting layer containing a first organic compound having a solid state fluorenscence peak wave length of 380 nm to shorter than 480 and a second light emitting layer containing a second organic compound having a solid state fluorescence peak wave length of 480 nm to shorter than 580 nm, one of the first and second light emitting layers further comprising a third organic compound having a solution state fluorescence peak wave length of 580 nm to 650 nm in a concentration of 0.1 to 10 mol % with respect to said first organic compound if said third organic compound is present in the first light emitting layer or with respect to said second organic compound if said third organic compound is present in the second light emitting layer; said device having a structure in which the first light emitting layer and the second light emitting layer are laminated on an anode in this order and both the first light emitting layer and the second light emitting layer emit light upon application of an electric field, wherein the first organic compound is an aromatic methylidine compound represented by the general formula (I):

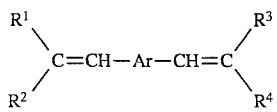

wherein R¹ and R⁴ indicate each a hydrogen atom, an alkyl group having 1 to 6 carbon atoms, an alkoxy group having 1 to 6 carbon atoms, an aralkyl group having 7 to 18 carbon atoms, a substituted or unsubstituted aryl group having 6 to 18 carbon atoms, a substituted or unsubstituted aromatic heterocyclic group, a substituted or unsubstituted cyclohexyl group, or a substituted or unsubstituted aryloxy group having 6 to 18 carbon atoms;

wherein said substituted groups are substituted with one or more substitutes selected from the group consisting of an alkyl group having 1 to 6 carbon atoms, an alkoxy group having 1 to 6 carbon atoms, an aralkyl group having 7 to 18 carbon atoms, an aryloxy group having 6 to 18 carbon atoms, an acyl group having 1 to 6 carbon atoms, an acyloxy group having 1 to 6 carbon atoms, carboxyl group, styryl group, an arylcarbonyl group having 6 to 20 carbon atoms, an aryloxycarbonyl group having 6 to 20 carbon atoms, an alkoxycarbonyl group having 1 to 6 carbon atoms, vinyl group, anilinocarbonyl group, carbamoyl group, phenyl group, nitro group, hydroxyl group and a hologen atom;

R¹ to R⁴ may be identical to or different from one another; R¹ and R², and R³ and R⁴ may combine through a substituent in one or both to form a substituted or unsubstituted saturated or unsaturated five-membered ring or a substituted or unsubstituted saturated or unsaturated six-membered ring;

Ar indicates a substituted or unsubstituted arylene group having 6 to 20 carbon atoms which may be mono-substituted or poly-substituted with a substituent as described above; substituents in the arylene group may combine with each other to form a substituted or unsubstituted saturated or unsaturated five-membered ring or a substituted or unsubstituted saturated or unsaturated six-membered ring; and, when Ar is unsubstituted phenylene, R¹ to R⁴ are each a group selected from the group consisting of an alkoxy group having 1 to 6 carbon atoms, an aralkyl group having 7 to 18 carbon atoms, a substituted or unsubstituted naphthyl group, biphenyl group, cyclohexyl group and an aryloxy group.

2. The organic electroluminescence device as defined in claim 1 wherein light emitted by said device upon application of an electric field is white light as measured on the CIE chromaticity diagram.

3. The organic electroluminescence device as defined in claim 1 wherein a recombination region in which injected holes and electrons are combined to form an excited state is present in both of the first light emitting layer and the second light emitting layer.

4. The organic electroluminescence device as defined in claim 1 wherein the device has a structure of an anode/a hole transporting layer/the first light emitting layer/the second light emitting layer/a cathode.

5. The organic electroluminescence device as defined in claim 4 wherein blue or bluish light is emitted from the first light emitting layer and red or reddish light is emitted from the second light emitting layer.

6. The organic electroluminescence device as defined in claim 4 wherein thickness of the second light emitting layer is the same as or larger than that of the first light emitting layer.

7. The organic electroluminescence device as defined in claim 4 wherein the second light emitting layer has electron transporting ability larger than hole transporting ability.

8. The organic electroluminescence device as defined in claim 4 wherein the second light emitting layer consists essentially of a metal complex of 8-hydroxyquinoline or a derivative thereof.

9. An organic electroluminescence device which comprises light emitting layers placed between a pair of electrodes at least one of which electrodes is transparent or translucent, said light emitting layers comprising a first light emitting layer containing a first organic compound having a solid state fluorescence peak wave length of from 380 nm to shorter than 480 nm and a second light emitting layer containing a second organic compound having a solid state fluorescence peak wave length of 480 nm to shorter than 580 nm, one of said first and second light emitting layers further comprising a third organic compound having a solution state fluorescence peak wave length of 580 nm to 650 nm in a concentration of 0.1 to 10 mol % with respect to said first organic compound if said third organic compound is present in the first light emitting layer or with respect to said second organic compound if said third organic compound is present in the second light emitting layer; said device having a structure in which the first light emitting layer and the second light emitting layer are laminated on an anode in this order and both the first light emitting layer and the second light emitting layer emit light upon application of an electric field, wherein the organic compound having a luminescence peak wave length of 380 nm to shorter than 480 nm in solid state is an aromatic methylidine compound represented by the general formula (II):

A—Q—B          (II)

wherein A and B indicate each a monovalent group having a structure obtained by removing one hydrogen atom from a compound represented by the general formula (I):

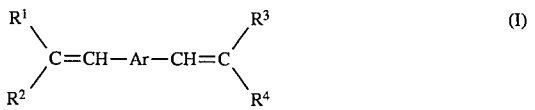

wherein $R^1$ to $R^4$ indicate each a hydrogen atom, an alkyl group having 1 to 6 carbon atoms, an alkoxy group having 1 to 6 carbon atoms, an aralkyl group having 7 to 18 carbon atoms, a substituted or unsubstituted aryl group having 6 to 18 carbon atoms, a substituted or unsubstituted aromatic heterocyclic group, a substituted or unsubstituted cyclohexyl group, or a substituted or unsubstituted aryloxy group having 6 to 18 carbon atoms;

wherein said substituted groups are substituted with one or more substituents selected from the group consisting of an alkyl group having 1 to 6 carbon atoms, an alkoxy group having 1 to 6 carbon atoms, an aralkyl group having 7 to 18 carbon atoms, an aryloxy group having 6 to 18 carbon atoms, an acyl group having 1 to 6 carbon atoms, an acyloxy group having 1 to 6 carbon atoms, carboxyl group, styryl group, an arylcarbonyl group having 6 to 20 carbon atoms, an aryloxycarbonyl group having 6 to 20 carbon atoms, an alkoxycarbonyl group having 1 to 6 carbon atoms, vinyl group, anilinocarbonyl group, carbamoyl group, phenyl group, nitro group, hydroxyl group and a halogen atom;

$R^1$ to $R^4$ may be identical to or different from one another; $R^1$ and $R^2$, and $R^3$ and $R^4$ may combine through a substituent in one or both to form a substituted or unsubstituted saturated or unsaturated five-membered ring or a substituted or unsubstituted saturated or unsaturated six-membered ring;

Ar indicates a substituted or unsubstituted arylene group having 6 to 20 carbon atoms which may be mono-substituted or poly-substituted with a substituent as described above; substituents in the arylene group may combine with each other to form a substituted or unsubstituted saturated or unsaturated five-membered ring or a substituted or unsubstituted saturated or unsaturated six-membered ring; and, when Ar is unsubstituted phenylene, $R^1$ to $R^4$ are each a group selected from the group consisting of an alkoxy group having 1 to 6 carbon atoms, an aralkyl group having 7 to 18 carbon atoms, a substituted or unsubstituted naphthyl group, biphenyl group, cyclohexyl group and an aryloxy group, wherein A and B may be identical to or different from each other, and Q indicates a divalent group breaking the conjugation.

10. The organic electroluminescence device as defined in claim 9 wherein light emitted by said device upon application of an electric field is white light as measured on the CIE chromaticity diagram.

11. The organic electroluminescence device as defined in claim 9 wherein a recombination region in which injected holes and electrons are combined to form an excited state is present in both of the first light emitting layer and the second light emitting layer.

12. The organic electroluminescence device as defined in claim 9 wherein the device has a structure of an anode/a hole transporting layer/the first light emitting layer/the second light emitting layer/a cathode.

13. The organic electroluminescence device as defined in claim 12 wherein blue or bluish light is emitted from the first light emitting layer and red or reddish light is emitted from the second light emitting layer.

14. The organic electroluminescence device as defined in claim 12 wherein thickness of the second light emitting layer is the same as or larger than that of the first light emitting layer.

15. The organic electroluminescence device as defined in claim 12 wherein the second light emitting layer has electron transporting ability larger than hole transporting ability.

16. The organic electroluminescence device as defined in claim 12 wherein the second light emitting layer consists essentially of a metal complex of 8-hydroxyquinoline or a derivative thereof.

17. An organic electroluminescence device which comprises light emitting layers placed between a pair of electrodes at least one of which electrodes is transparent or translucent, said light emitting layers comprising a first light emitting layer containing a first organic compound having a solid state fluorescence peak wave length of from 380 nm to shorter than 480 nm and a second light emitting layer containing a second organic compound having a solid state fluorescence peak wave length of 480 nm to shorter than 580 nm, one of said first and second light emitting layers further comprising a third organic compound having a solution state fluorescence peak wave length of 580 nm to 650 nm in a concentration of 0.1 to 10 mol % with respect to said first organic compound if said third organic compound is present in the first light emitting layer or with respect to said second organic compound if said third organic compound is present in the second light emitting layer; said device having a structure in which the first light emitting layer and the second light emitting layer are laminated on an anode in this order and both the first light emitting layer and the second light emitting layer emit light upon application of an electric field, wherein the first organic compound is an aromatic methylidine compound represented by the general formula (III):

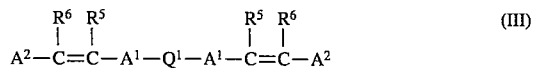

wherein $A^1$ indicates a substituted or unsubstituted arylene group having 6 to 20 carbon atoms or a substituted or unsubstituted divalent aromatic heterocyclic group; $A^2$ indicates a substituted or unsubstituted aryl group having 6 to 20 carbon atoms or a substituted or unsubstituted monovalent aromatic heterocyclic group, $R^5$ and $R^6$ indicate each a hydrogen atom, a substituted or unsubstituted aryl group having 6 to 20 carbon atoms, cyclohexyl group, a monovalent aromatic heterocyclic group, an alkyl group having 1 to 10 carbon atoms, an aralkyl group having 7 to 20 carbon atoms, or an alkoxy group having 1 to 10 carbon atoms, and may be identical to or different from each other; wherein said substituted groups are substituted with one or more of an alkyl group, an aryloxy group, amino group or a phenyl group which is unsubstituted or substituted with an alkyl group, an aryloxy group or an amino group; each substitutent in $R^5$ may combine with $A^1$ to form a saturated or unsaturated five-membered or six-membered ring; each substituent in $R^6$ may combine with $A^2$ to form a saturated or unsaturated five-membered or six-membered ring; and $Q^1$ indicates a divalent group breaking the conjugation.

18. The organic electroluminescence device as defined in claim 17 wherein light emitted by said device upon application of an electric field is white light as measured on the CIE chromaticity diagram.

19. The organic electroluminescence device as defined in claim 17 wherein a recombination region in which injected holes and electrons are combined to form an excited state is present in both of the first light emitting layer and the second light emitting layer.

20. The organic electroluminescence device as defined in claim 17 wherein the device has a structure of an anode/a hole transporting layer/the first light emitting layer/the second light emitting layer/a cathode.

21. The organic electroluminescence device as defined in claim 20 wherein blue or bluish light is emitted from the first light emitting layer and red or reddish light is emitted from the second light emitting layer.

22. The organic electroluminescence device as defined in claim 20 wherein thickness of the second light emitting layer is the same as or larger than that of the first light emitting layer.

23. The organic electroluminescence device as defined in claim 20 wherein the second light emitting layer has electron transporting ability larger than hole transporting ability.

24. The organic electroluminescence device as defined in claim 20 wherein the second light emitting layer consists essentially of a metal complex of 8-hydroxyquinoline or a derivative thereof.

25. An organic electroluminescence device which comprises light emitting layers placed between a pair of electrodes at least one of which electrodes is transparent or translucent, said light emitting layers comprising a first light emitting layer containing a first organic compound having a solid state fluorescence peak wave length of from 380 nm to shorter than 480 nm and a second light emitting layer containing a second organic compound having a solid state fluorescence peak wave length of 480 nm to shorter than 580 nm, one of said first and second light emitting layers further comprising a third organic compound having a solution state fluorescence peak wave length of 580 nm to 650 nm in a concentration of 0.1 to 10 mol % with respect to said first organic compound if said third organic compound is present in the first light emitting layer or with respect to said second organic compound if said third organic compound is present in the second light emitting layer; said device having a structure in which the first light emitting layer and the second light emitting layer are laminated on an anode in this order and both the first light emitting layer and the second light emitting layer emit light upon application of an electric field, wherein the first light emitting layer and/or the second light emitting layer comprise at least one compound selected from stilbene derivatives respresented by the general formulae (IV) and (V):

wherein $Ar^1$ indicates an aryl group having 6 to 20 carbon atoms; $R^7$ to $R^{10}$ indicate each independently a hydrogen atom or an aryl group having 6 to 20 carbon atoms; and $D^1$ to $D^3$ indicate each independently an aryl group having 6 to 20 carbon atoms and substituted with an electron-donating group or a condensed polycyclic group having 10 to 30 carbon atoms and substituted with an electron-donating group; therein $Ar^1$ and $R^7$ to $R^{10}$ may be each independently unsubstituted or substituted with an alkyl group having 1 to 10 carbon atoms, an aklkoxy group having 1 to 10 carbon atoms, an aryloxy group having 6 to 10 carbon atoms, an aralkyl group having 6 to 10 carbon atoms or an amino group containing hydrocarbon groups having 1 to 20 carbon atoms.

26. The organic electroluminescence device as defined in claim 25 wherein light emitted by said device upon application of an electric field is white light as measured on the CIE chromaticity diagram.

27. The organic electroluminescence device as defined in claim 25 wherein a recombination region in which injected holes and electrons are combined to form an excited state is present in both of the first light emitting layer and the second light emitting layer.

28. The organic electroluminescence device as defined in claim 25 wherein the device has a structure of an anode/a hole transporting layer/the first light emitting layer/the second light emitting layer/a cathode.

29. The organic electroluminescence device as defined in claim 28 wherein blue or bluish light is emitted from the first light emitting layer and red or reddish light is emitted from the second light emitting layer.

30. The organic electroluminescence device as defined in claim 28 wherein thickness of the second light emitting layer is the same as or larger than that of the first light emitting layer.

31. The organic electroluminescence device as defined in claim 28 wherein the second light emitting layer has electron transporting ability larger than hole transporting ability.

32. The organic electroluminescence device as defined in claim 28 wherein the second light emitting layer consists essentially of a metal complex of 8-hydroxyquinoline or a derivative thereof.

33. An organic electroluminescence device which comprises light emitting layers placed between a pair of electrodes at least one of which electrodes is transparent or translucent, said light emitting layers comprising a first light emitting layer containing a first organic compound having a solid state fluorescence peak wave length of from 380 nm to shorter than 480 nm and a second light emitting layer containing a second organic compound having a solid state fluorescence peak wave length of 480 nm to shorter than 580 nm, one of said first and second light emitting layers further comprising a third organic compound having a solution state fluorescence peak wave length of 580 nm to 650 nm in a concentration of 0.1 to 10 mol % with respect to said first organic compound if said third organic compound is present in the first light emitting layer or with respect to said second organic compound if said third organic compound is present in the second light emitting layer; said device having a structure in which the first light emitting layer and the second light emitting layer are laminated on an anode in this order and both the first light emitting layer and the second light emitting layer emit light upon application of an electric field, wherein at least one of the first light emitting layer and the second light emitting layer comprises at least one compound selected from distyrylarylene derivatives represented by the general formulae (VI) and (VII):

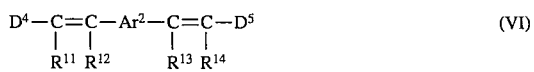

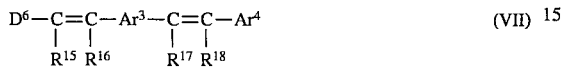

wherein $Ar^2$ and $Ar^3$ indicate each independently an arylene group having 6 to 20 carbon atoms; $Ar^4$ indicates an aryl group having 6 to 20 carbon atoms; $R^{11}$ to $R^{18}$ indicate each independently a hydrogen atom or an aryl group having 6 to 20 carbon atoms; wherein $Ar^2$ to $Ar^4$ and $R^{11}$ to $R^{18}$ may be each independently unsubstituted or substituted with an alkyl group having 1 to 10 carbon atoms, an alkoxy group having 1 to 10 carbon atoms, an aryloxy group having 6 to 10 carbon atoms, an aralkyl group having 6 to 10 carbon atoms or an amino group containing hydrocarbon groups having 1 to 20 carbon atoms; and $D^4$ to $D^6$ indicate each independently an aryl group having 6 to 20 carbon atoms and substituted with an electron-donating group or a condensed polycyclic group having 10 to 30 carbon atoms and substituted with an electron-donating group.

34. The organic electroluminescence device as defined in claim 33 wherein light emitted by said device upon application of an electric field is white light as measured on the CIE chromaticity diagram.

35. The organic electroluminescence device as defined in claim 33 wherein a recombination region in which injected holes and electrons are combined to form an excited state is present in both of the first light emitting layer and the second light emitting layer.

36. The organic electroluminescence device as defined in claim 33 wherein the device has a structure of an anode/a hole transporting layer/the first light emitting layer/the second light emitting layer/a cathode.

37. The organic electroluminescence device as defined in claim 36 wherein blue or bluish light is emitted from the first light emitting layer and red or reddish light is emitted from the second light emitting layer.

38. The organic electroluminescence device as defined in claim 36 wherein thickness of the second light emitting layer is the same as or larger than that of the first light emitting layer.

39. The organic electroluminescence device as defined in claim 36 wherein the second light emitting layer has electron transporting ability larger than hole transporting ability.

40. The organic electroluminescence device as defined in claim 36 wherein the second light emitting layer consists essentially of a metal complex of 8-hydroxyquinoline or a derivative thereof.

41. An organic electroluminescence device which comprises light emitting layers placed between a pair of electrodes at least one of which electrodes is transparent or translucent, said light emitting layers comprising a first light emitting layer containing a first organic compound having a solid state fluorescence peak wave length of from 380 nm to shorter than 480 nm and a second light emitting layer containing a second organic compound having a solid state fluorescence peak wave length of 480 nm to shorter than 580 nm, one of said first and second light emitting layers further comprising a third organic compound having a solution state fluorescence peak wave length of 580 nm to 650 nn in a concentration of 0.1 to 10 mol % with respect to said first organic compound if said third organic compound is present in the first light emitting layer or with respect to said second organic compound if said third organic compound is present in the second light emitting layer; said device having a structure in which the first light emitting layer and the second light emitting layer are laminated on an anode in this order and both the first light emitting layer and the second light emitting layer emit light upon application of an electric field, wherein at least one of the first light emitting layer and the second light emitting layer comprises at least one compound selected from trisstyrylarylene derivatives represented by the general formulae (VIII), (IX) and (X):

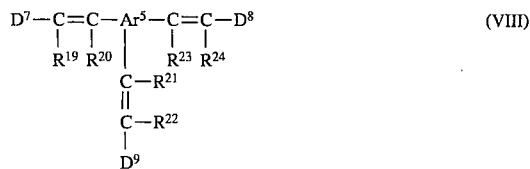

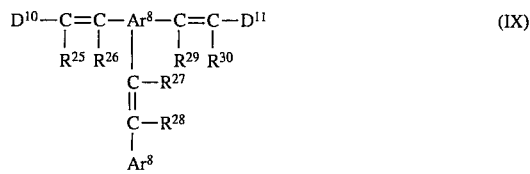

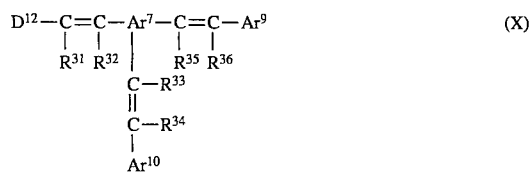

wherein $Ar^5$ and $Ar^7$ indicate each independently a trivalent aromatic cyclic group having 6 to 24 carbon atoms; $Ar^8$ to $Ar^{10}$ indicate each independently an aryl group having 6 to 20 carbon atoms; $R^{19}$ to $R^{36}$ indicate each independently a hydrogen atom or an aryl group having 6 to 20 carbon atoms; and $D^7$ to $D^{12}$ indicate each independently an aryl group having 6 to 20 carbon atoms and substituted with an electron-donating group or a condensed polycyclic group having 10 to 30 carbon atoms and substituted with an electron-donating group; therein $Ar^5$ to $Ar^7$ and $R^{19}$ to $R^{36}$ may be each independently unsubstituted or substituted with an alky group having 1 to 10 carbon atoms, an alkoxy group having 1 to 10 carbon atoms, an aryloxy group having 6 to 10 carbon atoms, an aralkyl group having 6 to 10 carbon atoms or an amino group containing hydrocarbon groups having 1 to 20 carbon atoms.

42. The organic electroluminescence device as defined in claim 41 wherein light emitted by said device upon application of an electric field is white light as measured on the CIE chromaticity diagram.

43. The organic electroluminescence device as defined in claim 41 wherein a recombination region in which injected holes and electrons are combined to form an excited state is present in both of the first light emitting layer and the second light emitting layer.

44. The organic electroluminescence device as defined in claim 41 wherein the device has a structure of an anode/a hole transporting layer/the first light emitting layer/the second light emitting layer/a cathode.

45. The organic electroluminescence device as defined in claim 44 wherein blue or bluish light is emitted from the first light emitting layer and red or reddish light is emitted from the second light emitting layer.

46. The organic electroluminescence device as defined in claim 44 wherein thickness of the second light emitting layer is the same as or larger than that of the first light emitting layer.

47. The organic electroluminescence device as defined in claim 44 wherein the second light emitting layer has electron transporting ability larger than hole transporting ability.

48. The organic electroluminescence device as defined in claim 44 wherein the second light emitting layer consists essentially of a metal complex of 8-hydroxyquinoline or a derivative thereof.

* * * * *